United States Patent
Yamaoka et al.

(10) Patent No.: US 9,823,882 B2
(45) Date of Patent: *Nov. 21, 2017

(54) SEMICONDUCTOR DEVICE AND INFORMATION PROCESSING DEVICE

(71) Applicant: Hitachi, Ltd., Tokyo (JP)

(72) Inventors: Masanao Yamaoka, Tokyo (JP); Kenichi Osada, Tokyo (JP); Chihiro Yoshimura, Tokyo (JP)

(73) Assignee: HITACHI, LTD., Tokyo (JP)

( * ) Notice: Subject to any disclaimer, the term of this patent is extended or adjusted under 35 U.S.C. 154(b) by 280 days.

This patent is subject to a terminal disclaimer.

(21) Appl. No.: 14/643,567

(22) Filed: Mar. 10, 2015

(65) Prior Publication Data

US 2016/0062704 A1    Mar. 3, 2016

(30) Foreign Application Priority Data

Aug. 29, 2014 (JP) ................................ 2014-176234

(51) Int. Cl.
*G06F 3/06* (2006.01)
*G06N 7/00* (2006.01)
(Continued)

(52) U.S. Cl.
CPC .......... *G06F 3/0673* (2013.01); *G06F 3/0604* (2013.01); *G06F 3/0638* (2013.01);
(Continued)

(58) Field of Classification Search
CPC ............. G06F 19/704; G06F 2217/10; G06F 2217/16; G06F 11/3013; G06F 11/3096;
(Continued)

(56) References Cited

U.S. PATENT DOCUMENTS 6,401,237 B1 * 6/2002 Ishikawa ................... G06F 8/30
345/441
6,601,229 B1 * 7/2003 Niederer ........ G01B 31/318357
716/106
(Continued)

FOREIGN PATENT DOCUMENTS

WO    2012/118064 A1    9/2012

OTHER PUBLICATIONS

Byrnes et al.; "Optimization using Bose-Einstein condensation and measurement-feedback circuits"; Feb. 19, 2013; E. L. Ginzton Laboratory, Stanford University, Stanford, CA 94305.*
(Continued)

*Primary Examiner* — Helen Rossoshek
(74) *Attorney, Agent, or Firm* — Volpe and Koenig, P.C.

(57) ABSTRACT

In a semiconductor device in which components to be a basic configuration unit are arranged in an array shape for calculating an interaction model, a technique capable of changing a topology between the components is provided. A semiconductor device includes a plurality of units each of which includes a first memory cell for storing a value indicating a state of one node of an interaction model, a second memory cell for storing an interaction coefficient indicating an interaction from a node connected to the one node, and a calculation circuit for determining a value indicating a next state of the one node based on a value indicating a state of the connected node and on the interaction coefficient. In addition, the semiconductor device includes a plurality of switches for connecting or disconnecting the plurality of units to/from each other.

11 Claims, 19 Drawing Sheets

(51) Int. Cl.
*G11C 11/16* (2006.01)
*G06F 11/30* (2006.01)
*G06F 17/30* (2006.01)
*G06F 17/50* (2006.01)
*G06F 17/18* (2006.01)
*G06F 13/16* (2006.01)
*G06N 99/00* (2010.01)

(52) U.S. Cl.
CPC .......... *G06N 7/005* (2013.01); *G11C 11/1659* (2013.01); *G06F 11/3096* (2013.01); *G06F 13/1668* (2013.01); *G06F 17/18* (2013.01); *G06F 17/3053* (2013.01); *G06F 17/5009* (2013.01); *G06N 99/002* (2013.01)

(58) Field of Classification Search
CPC .............. G06F 11/3466; G06F 13/1668; G06F 17/5009; G06F 17/18; G06F 17/3053; G11C 11/1659; G11C 11/16; G11C 7/1006; G11C 11/419; G11C 11/1675; G06N 7/005

See application file for complete search history.

(56) References Cited

U.S. PATENT DOCUMENTS

| | | | | |
|---|---|---|---|---|
| 7,076,407 B2* | 7/2006 | Liu | ......................... | G06F 17/504 703/16 |
| 7,085,700 B2* | 8/2006 | O'Riordan | .......... | G06F 17/5036 703/14 |
| 7,096,174 B2* | 8/2006 | Beattie | ................ | G06F 17/5036 703/14 |
| 7,145,898 B1* | 12/2006 | Elliott | ..................... | H04L 12/66 370/352 |
| 7,711,533 B2* | 5/2010 | Wilensky | ............ | G06F 17/5009 703/13 |
| 7,860,810 B2* | 12/2010 | Raffo | .................. | G06F 17/5009 706/6 |
| 9,075,510 B1* | 7/2015 | Yan | ........................ | G06F 8/34 |
| 9,331,695 B2* | 5/2016 | Yoshimura | ......... | H03K 19/0002 |
| 9,342,792 B2* | 5/2016 | Utsunomiya | ........ | G06N 99/002 |
| 9,430,845 B2* | 8/2016 | Yoshimura | ............. | G06N 7/005 |
| 9,472,306 B2* | 10/2016 | Yamaoka | ................ | G11C 29/08 |
| 9,588,911 B2* | 3/2017 | Yamaoka | ............. | G06F 13/1652 |
| 9,606,965 B2* | 3/2017 | Yoshimura | ............. | G06F 17/18 |
| 9,633,715 B2* | 4/2017 | Yoshimura | ............. | G11C 11/419 |
| 2006/0031053 A1* | 2/2006 | Chen | ..................... | G06F 19/704 703/12 |
| 2006/0138397 A1* | 6/2006 | Mattis | ................... | H01L 39/146 257/15 |
| 2008/0313582 A1* | 12/2008 | El Rai | ................ | G06F 17/5036 716/136 |
| 2009/0055150 A1* | 2/2009 | Prior | .................... | G06F 19/3437 703/11 |
| 2009/0066366 A1* | 3/2009 | Solomon | ........... | G06F 15/17387 326/41 |
| 2011/0313736 A1* | 12/2011 | Johnston | ............. | G06F 17/5009 703/2 |
| 2013/0185047 A1* | 7/2013 | Jackson | ............... | G06F 17/5009 703/22 |
| 2013/0226540 A1* | 8/2013 | Pita | ..................... | G06F 17/5009 703/2 |
| 2014/0046626 A1 | 2/2014 | Yamamoto et al. | | |
| 2014/0200953 A1* | 7/2014 | Mun | ...................... | G06Q 10/04 705/7.28 |
| 2014/0297247 A1* | 10/2014 | Troyer | ................ | G06F 17/5009 703/21 |
| 2015/0106316 A1* | 4/2015 | Birdwell | .................. | G06N 3/08 706/33 |
| 2015/0278408 A1* | 10/2015 | Yoshimura | .......... | G06F 17/5009 703/2 |
| 2016/0062951 A1* | 3/2016 | Yoshimura | .............. | G06F 17/18 708/190 |
| 2016/0063148 A1* | 3/2016 | Hayashi | .............. | G06F 17/5009 703/2 |
| 2016/0063391 A1* | 3/2016 | Hayashi | .................. | G06F 7/588 706/11 |
| 2016/0064050 A1* | 3/2016 | Yoshimura | ............... | G11C 7/12 365/51 |
| 2016/0064053 A1* | 3/2016 | Yamaoka | ............... | G11C 7/222 711/103 |
| 2016/0293048 A1* | 10/2016 | Dubois | .................... | H04L 67/28 |
| 2017/0024658 A1* | 1/2017 | Utsunomiya | ........... | G06N 5/02 |
| 2017/0068632 A1* | 3/2017 | Yoshimura | .............. | G11C 11/16 |

OTHER PUBLICATIONS

Yoshimura et al.; "Spatial computing architecture using randomness of memory cell stability under voltage control"; Year: 2013; 2013 European Conference on Circuit Theory and Design (ECCTD); pp. 1-4.*

Janesky et al.; "Magnetostatic interactions between sub-micrometer patterned magnetic elements"; Year: 2001; IEEE Transactions on Magnetics, vol. 37, Issue: 4; pp. 2052-2054.*

* cited by examiner

SPIN UNIT 300

- ⊕ SPIN
- ▭ INTERACTION COEFFICIENT
- ☐ EXTERNAL MAGNETIC FIELD COEFFICIENT

SEMICONDUCTOR DEVICE AND INFORMATION PROCESSING DEVICE

CROSS-REFERENCE TO RELATED APPLICATION

The present application claims priority from Japanese Patent Application No. 2014-176234 filed on Aug. 29, 2014, the content of which is hereby incorporated by reference into this application.

TECHNICAL FIELD OF THE INVENTION

The present invention relates to a semiconductor device. More particularly, the present invention relates to a semiconductor device to calculate an interaction model, and relates to an information processing device to control the semiconductor device as an accelerator.

BACKGROUND OF THE INVENTION

Currently, a mainstream of a computer architecture is a Neumann type. An operation of the Neumann-type architecture is defined by a program which is a sequential instruction string. The Neumann-type architecture has such general versatility as being available for various uses by changing the program. Not only a CPU (Central Processing Unit) that plays a central role of a computer but also a specific-use arithmetic device such as a GPU (Graphics Processing Unit) is configured of the Neumann-type architecture, and its basic operation is performedby sequentially executing the instruction string.

Until now, a performance of a computer has been improved mainly depending on improvement in a clock frequency. Since a foundation of the Neumann-type architecture is to sequentially execute the instruction string, the performance improvement can be expected by increasing an execution speed of an instruction. However, in a general-purpose CPU used for a personal computer or a server, the improvement in the clock frequency has peaked out at about 3 GHz in the early 2000s. In recent years, instead of the clock frequency which has peaked out, a method of achieving the performance improvement by parallel processing based on a multi core technique has become a mainstream.

In the parallel processing by the multi core technique, the performance improvement is achieved by finding out a parallel-executable part from the sequential instruction string (by extraction of parallelism), and performing the parallel execution. However, it is not easy to extract the parallelism from a program created by writing down the sequential algorithm as the instruction string. An ILP (Instruction Level Parallelism) which extracts the parallelism on an instruction level has already reached a limit, and a trend of use of the coarser-grain parallelism such as a TLP (Thread Level Parallelism) and a DLP (Data Level Parallelism) has appeared in recent years.

In consideration of such a situation, in order to achieve the performance improvement of the computer in the future, the execution of the sequential instruction string as conventional is not put on the basic technique, and it is required to shift the technique to an essentially parallel information processing. For that, instead of a problem description method by the conventional sequential instruction string, a problem description method suitable for achieving the essentially parallel information processing is required.

As its candidate, various physical phenomena and social phenomena can be expressed by an interaction model. The interaction model is a model defined by a plurality of nodes forming the model, an interaction between the nodes, and besides, a bias for every node as needed. Various models are proposed in physics or social sciences, and all of them can be interpreted as one aspect of the interaction model. In addition, as features of the interaction model, a point that an inter-node influence is limited to an interaction between two nodes (interaction between 2 bodies) is cited. For example, when dynamics of planets in cosmic space is considered, this model can be interpreted also as one type of the interaction model in a point that the interaction caused by universal gravity exists between the nodes which are the planes. However, inter-planet influence is not limited between two planets, and three or more planets affect each other, and exhibit complicated behaviors (which becomes a problem referred to as so-called three-body problem and many-body problem).

As an example of a typical interaction model in the field of physics, an Ising model can be cited. The Ising model is a model of statistical mechanics for describing behavior of a magnetic substance, and is used for research of the magnetic substance. The Ising model is defined as an interaction between sites (spins which take two values of +1/−1). It is known that acquirement of a ground state of the Ising model in which a topology has a non-plane graph is an NP-hard problem. In the Ising model, a problem is expressed by an interaction coefficient which is spread in a spatial direction, and therefore, there is a possibility of achievement of the information processing using the essential parallelism.

Incidentally, since the acquirement of the ground state of the Ising model is the NP-hard problem as described above, the solution by the Neumann-type computer is accompanied by a difficulty in view of computation time. While an algorithm for achieving the high speed by introducing heuristics is also proposed, a method of acquiring the ground state of the Ising model by using not the Neumann-type computer but a computation using physical phenomena more directly, that is, an analog computer has been proposed. For example, as such a device, a device described in International Publication No. WO/2012/118064 (Patent Document 1) is cited.

SUMMARY OF THE INVENTION

In the device as described in the Patent Document 1, parallelism for supporting a problem to be solved is required. Even in the case of the Ising model, an element which achieves the interaction among spins is required in accordance with the number of spins of the Ising model for searching for the ground state. For example, in the device described in the Patent Document 1, a spin and a laser are in accordance with each other, and the number of lasers proportional to the number of spins is required. That is, a scalability level which can achieve many elements is required. Therefore, it is desired that the ground state of the Ising model can be searched by a solid state element such as a semiconductor device which can be achieved by orderly arranging many elements which become configuration units. More particularly, it is desired that the semiconductor device has an array structure which is represented by a memory device such as an SRAM, and that a topology between the elements to be the configuration units can be changed.

A typical object of the present invention is, in a semiconductor device in which components to be basic configuration units are arranged in an array shape for calculating the interaction model, to provide a technique capable of change a topology between the components.

The above and other objects and novel characteristics of the present invention will be apparent from the description of the present specification and the accompanying drawings.

The typical summary of the inventions disclosed in the present application will be briefly described as follows.

The typical semiconductor device includes a plurality of units each of which includes: a first memory cell for storing a value indicating a state of one node of an interaction model; a second memory cell for storing an interaction coefficient indicating an interaction from a node connected to the one node; and a calculation circuit for determining a value indicating a next state of the one node based on a value indicating a state of the connected node and the interaction coefficient. In addition, the semiconductor device has a plurality of switches for connecting or disconnecting the plurality of units to/from each other.

For example, the plurality of switches include a first switch for coupling or dividing a calculation circuit of a first unit and a calculation circuit of a second unit among the plurality of units. More preferably, the plurality of switches include a second switch for outputting a value of the first memory cell in the first unit among the plurality of units to a second unit. More preferably, the plurality of switches include a third switch for inputting a value of the first memory cell in the second unit among the plurality of units to the first unit.

The effects obtained by typical aspects of the invention disclosed in the present application will be briefly described below.

In a semiconductor device in which components which are basic configuration units for calculating the interaction model are arranged in an array shape, the typical effect can provide a technique capable of changing a topology among the components.

BRIEF DESCRIPTIONS OF THE DRAWINGS

DESCRIPTIONS OF THE PREFERRED EMBODIMENTS

Figure 1:
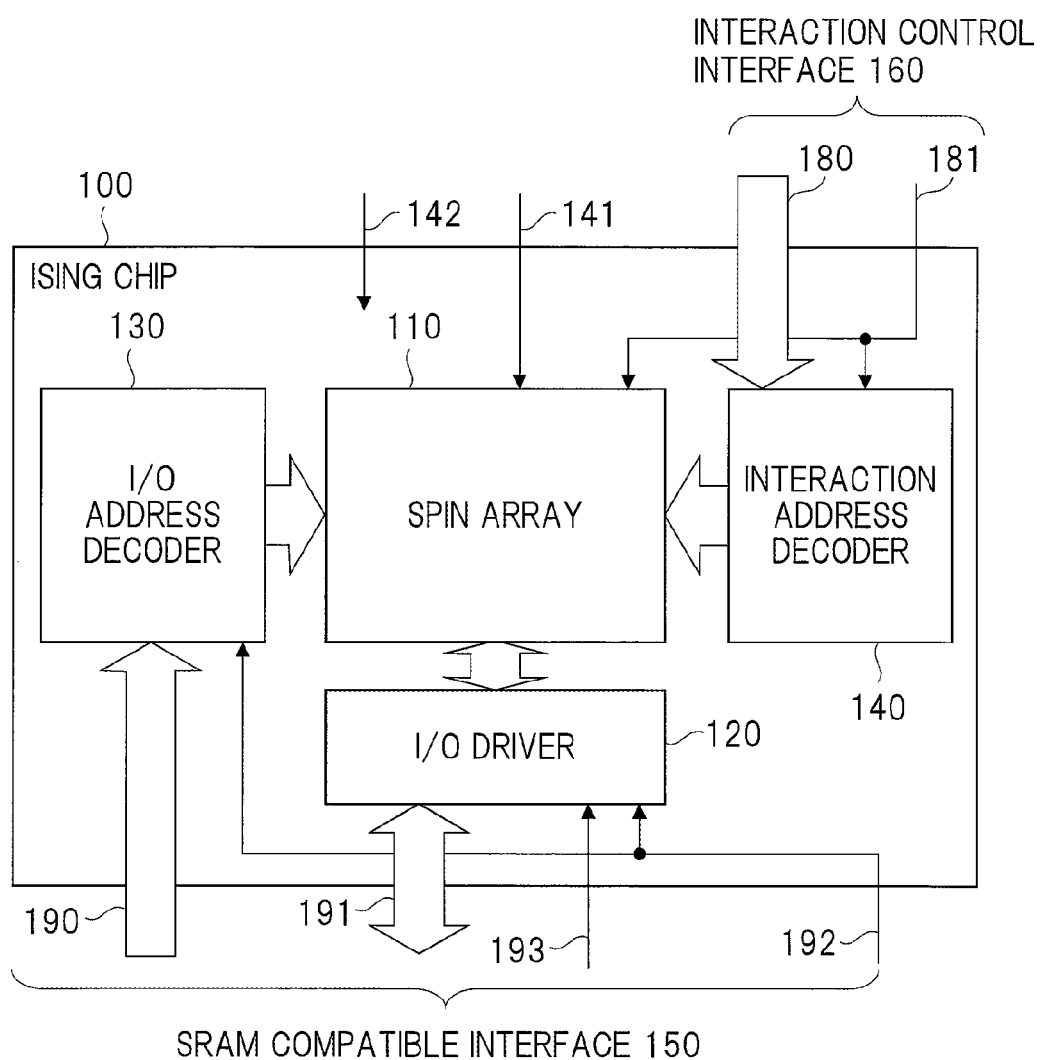
FIG. 1 is a diagram for explaining a configuration example of an Ising chip in an embodiment of the present invention.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are described, the substantially approximate and similar shapes and the like are included therein unless otherwise stated or except the case where it is conceivable that they are apparently excluded in principle. The same goes for the numerical value and the range described above.

Hereinafter, an embodiment of the present invention will be described in detail based on the accompanying drawings. Note that the same components are denoted by the same or related reference symbols throughout all the drawings for describing the embodiment, and the repetitive description thereof will be omitted. Further, in the embodiment described below, the explanation for the same or similar part is not repeated in principle unless otherwise particularly required.

[Embodiment]

The present embodiment relates to a semiconductor device which calculates an interaction model, and relates to an information processing device which controls the semiconductor device as an accelerator.

<0. Definition of Interaction Model>

Various physical phenomena and social phenomena can be expressed by an interaction model. The interaction model is a model defined by a plurality of nodes forming the model, an interaction among the nodes, and besides, a bias for every node as needed. While various models are proposed in physics or social sciences, all of them can be interpreted as one aspect of the interaction model. In addition, as a feature of the interaction model, an influence among the nodes is limited to an interaction between two nodes (interaction between two bodies). For example, when dynamics of planets in cosmic space is considered, this case can be interpreted also as one type of the interaction model in a point that an interaction caused by universal gravity is provided among nodes which are planets. However, the influence among the planets is not only limited between two planets, and three or more planets affect one another, and exhibit complicated behavior (which arises a problem referred to as so-called three-body problem or many-body problem).

As an example of a typical interaction model in the field of physics, an Ising model can be cited. As for the Ising model, the model is defined by an interaction coefficient which defines an interaction between two spins and an external magnetic field coefficient which is a bias for each spin while a spin which takes the spins having two states of +1/−1 (or, up/down, etc.) as the nodes. In addition, in the field of biology, a neural network obtained by modeling a brain is an example of the interaction model. In the neural network, while taking an artificial neuron obtained by simulating a neuron of a nerve cell as the node, such interaction as synapse connection is provided between the artificial neurons. In addition, a bias may be provided for every neuron in some cases. In the field of social sciences, when, for example, communication between human beings is considered, it can be understood easily that an interaction made by language or communication is provided while taking the node which is the human being. In addition, it can be also imagined that a bias is individually provided for each human being. Therefore, it has been studied to try clarifying characteristics of the communication between the human beings by simulating the communication between the human beings as an Ising model etc. which is common in a point of the interaction model.

The following is explanation for examples of an Ising chip 100 (FIG. 1) which is a semiconductor device used for acquiring the ground state of the Ising model, and an information processing device 200 (FIG. 2) which controls the Ising chip 100.

<1. Conversion of a Problem to be Solved into a Ground-State Search Problem of the Ising Model>

The Ising model is a model of statistical mechanics for describing the behavior of the magnetic substance. The Ising model is defined by spins which have two states of 1/−1 (or, 0/1, or up/down), an interaction coefficient indicating an interaction between the spins, and an external magnetic field coefficient which is provided for every spin.

By the Ising model, from provided spin array, interaction coefficient and external magnetic field coefficient, energy at that time can be calculated. An energy function "E(σ)" of the Ising model, is generally expressed by the following formula (1).

[Formula 1]

$$E(\sigma) = -\sum_{(i,j)} j_{i,j}\sigma_i\sigma_j - \sum_i h_i\sigma_i \qquad (1)$$

Note that it is assumed that "$\sigma_i$" and "$\sigma_j$" indicate values of the i-th and j-th spins, respectively, "$J_{i,j}$" indicates an interaction coefficient between the i-th and j-th spins, "$h_i$" indicates an external magnetic field coefficient with respect to the i-th spin, "<i, j>" indicates a combination of adjacent two sites, and "σ" indicates a spin array.

The acquisition of the ground state of an Ising model is an optimization problem to acquire a spin array which minimizes the energy function of the Ising model. For example, a problem having apparently no relation to the magnetic substance such as factorization problem and a traveling salesman problem can be converted into the Ising model. Then, the ground state of the Ising model, acquired by the conversion corresponds to a solution of the original problem. From this, it can be said that a device which can search for the ground state of the Ising model is a computer which is available for a general-purpose use.

<2. Configuration of Ising Chip>

FIG. 1 is a diagram for explaining an example of a configuration of the Ising chip 100 in the present embodiment. The Ising chip 100 is configured of a spin array 110, an I/O (Input/Output) driver 120, an I/O address decoder 130, and an interaction address decoder 140. In the present embodiment, while the Ising chip 100 is explained in the assumption that the Ising chip 100 is mounted as a CMOS (Complementary Metal-Oxide Semiconductor) integrated circuit which is currently widely used, it can be achieved also by other solid-state element.

The Ising chip 100 has an SRAM compatible interface 150 for performing reading/writing to the spin array 110, and is configured of an address bus 190, a data bus 191, a R/W control line 193 and an I/O clock line 192. In addition, as an interaction control interface 160 for controlling the ground state search of the Ising model, the Ising chip 100 has an interaction address line 180 and an interaction clock line 181. While the Ising chip 100 is operated by a voltage supplied by a normal power source line 142, a part of the spin array 110 is operated by a voltage supplied by a spin power source line 141. Specifically, a memory cell which stores spin information among memory cells included in the spin unit 300 (FIG. 3) forming the spin array 110 is operated by a voltage supplied by the spin power source line 141.

In the Ising chip 100, all of the spin $\sigma_i$, the interaction coefficient $J_{i,j}$ and the external magnetic field coefficient $h_i$ of the Ising model are expressed by information stored in the memory cell in the spin array 110. The reading/writing of the spin $\sigma_i$ are performed by the SRAM compatible interface 150 in order to set an initial state of the spin $\sigma_i$ and read the solution after completion of the ground state search. In addition, in order to set the Ising model whose ground state is to be searched to the Ising chip 100, the reading/writing of the interaction coefficient $J_{i,j}$ and the external magnetic field coefficient $h_i$ are also performed by the SRAM compatible interface 150. Therefore, an address is provided to the spin $\sigma_i$, the interaction coefficient $J_{i,j}$ and the external magnetic field coefficient $h_i$ in the spin array 110.

Note that the address bus 190, the data bus 191 and the R/W control line 193 which form the SRAM compatible interface 150 operate in synchronization with a clock which is inputted into the I/O clock line 192. However, in the present invention, an interface is not required to be a synchronous type, but may be an asynchronous interface type. In the present embodiment, the explanation will be made on the premise of the synchronous-type interface.

In addition, in the Ising chip 100, the interaction between the spins is achieved inside the spin array 110 for performing the ground state search. A unit for controlling this interaction from the outside is the interaction control interface 160. Specifically, an address for specifying a spin group which performs the interaction is inputted via the interaction address line 180, and the interaction is performed in synchronization with a clock inputted via the interaction clock line 181.

Note that the interaction may be achieved by not always only a clock synchronization circuit but also an asynchronous circuit. This case is on the premise that a role of the interaction clock line 181 is not to input the clock but to be an enable signal which permits execution of the interaction. While the interaction control interface may be not always only required to be the synchronous type but also be an asynchronous-type interface, the explanation in the present embodiment will be made on the premise that the synchronous interface is used, and that the interaction is performed in synchronization with the clock inputted via the interaction clock line 181.

<3. Configuration of Information Processing Device>

In order to achieve the information processing by using one or a plurality of the Ising chips 100 described above, it is required to control the interface as described above. Therefore, the Ising chip 100 is used as a part of the information processing device 200 as illustrated in FIG. 2.

Figure 2:
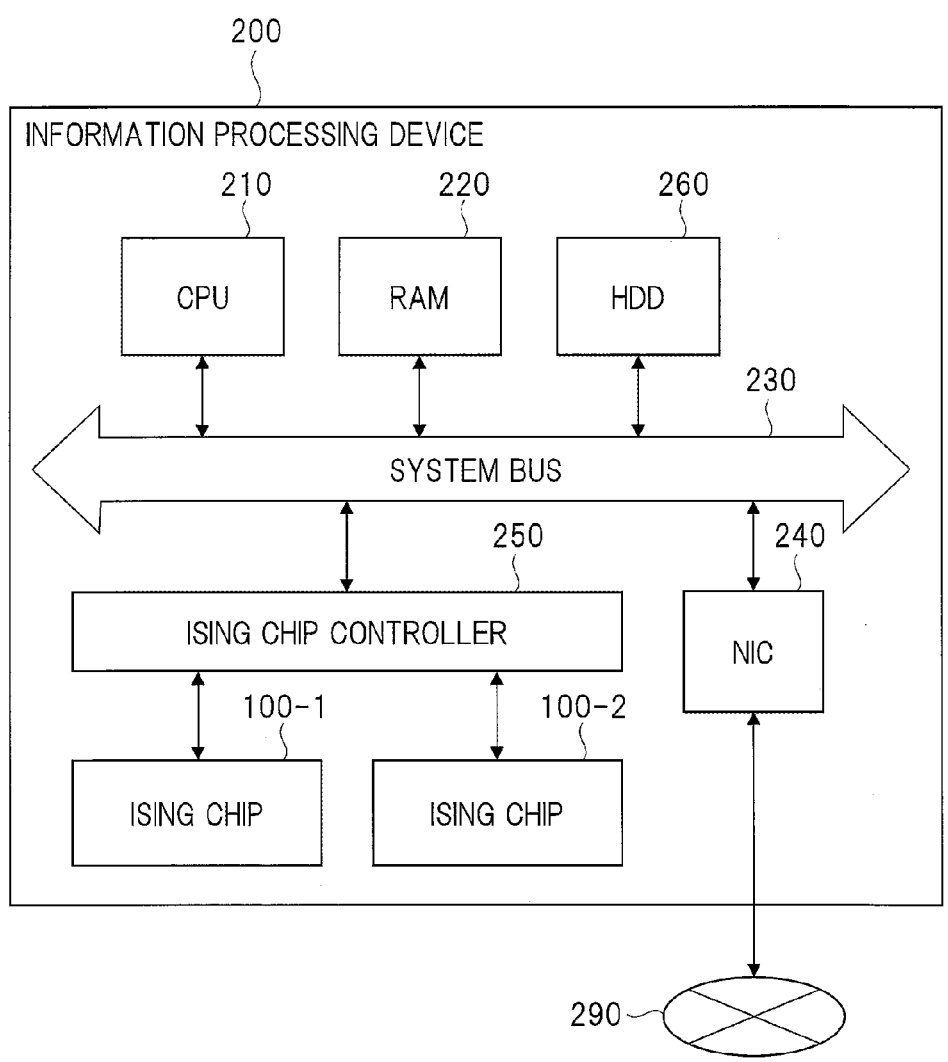
FIG. 2 is a diagram for explaining a configuration example of an information processing device in an embodiment of the present invention.

FIG. 2 is a diagram for explaining a configuration example of the information processing device 200 in the present embodiment. The information processing device 200 may be considered to be a unit obtained by attaching an accelerator configured of the Ising chip 100 to a device such as a personal computer and a server which are currently generally used. The information processing device 200 has a CPU (Central Processing Unit) 210, a RAM (Random Access Memory) 220, a HDD (Hard Disk Drive) 260, and a NIC (Network Interface Card) 240, etc., and they are coupled by a system bus 230. This is a configuration generally seen in the current personal computer and the server.

In addition, an Ising chip controller 250 is connected to the system bus 230, and one or a plurality of Ising chips are provided beyond the Ising chip controller (in an example of FIG. 2, two Ising chips 100-1 and 100-2 are provided. Hereinafter, they are simply referred to as the Ising chip 100 when it is not particularly required to distinguish the two Ising chips from each other). The Ising chip controller 250 and the Ising chip 100 corresponds to the accelerator, and take such a mode as an expansion card inserted into a peripheral-expansion interface such as a PCI Express. The Ising chip controller 250 is a unit for converting a protocol of the system bus 230 (such as the PCI Express and a QPI) in accordance with an interface of the Ising chip 100.

Software which operates on the CPU 210 of the information processing device 200 can control the Ising chip 100 via the Ising chip controller 250 generally by performing the reading/writing to/from a specific address. In addition, a plurality of such information processing devices 200 may be coupled via an inter-device network 290 for use.

The information processing device 200 achieves the ground state search of the Ising model by the control of the Ising chip controller 250 by the CPU 210 and the control of the SRAM compatible interface 150 and the interaction control interface 160 of the Ising chip 100 by the Ising chip controller 250.

<4. Configuration of Spin Array>

Figure 3:
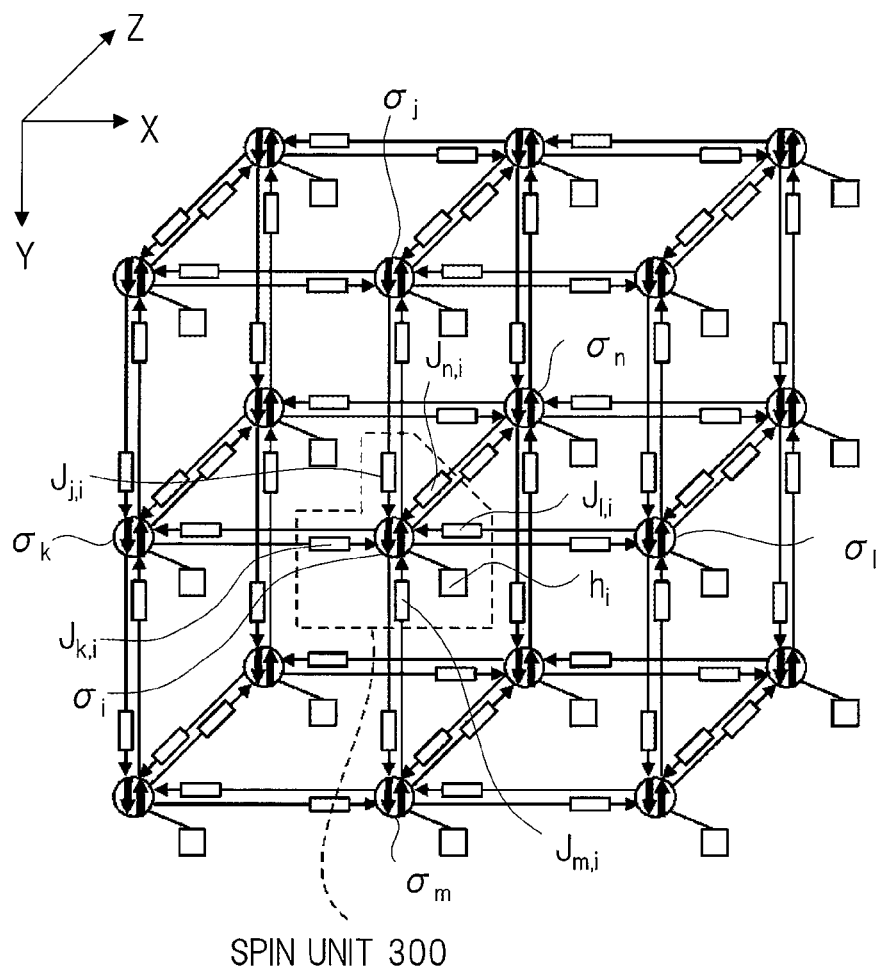
FIG. 3 is a diagram for explaining a configuration example of a spin array having a three-dimensional lattice in an embodiment of the present invention.

The spin array 110 is configured by arranging a lot of spin units 300 as a basic configuration unit each of which achieves to store one spin and the interaction coefficient and the external magnetic field coefficient which accompany the spin and to perform a processing of the ground state search and each of which is a basic configuration unit. FIG. 3 is a diagram for explaining a configuration example of the spin array 110 having a three-dimensional lattice. FIG. 3 shows an example in which the Ising model having a three-dimensional lattice-shaped topology is configured by arranging a plurality of spin units 300. The example of FIG. 3 shows a three-dimensional lattice having a size of "3 (X-axial direction)×3 (Y-axial direction)×2 (Z-axial direction)". As shown in the drawing, the coordinate axes are defined so that a right direction in the drawing is an X-axis, a downward direction in the drawing is a Y-axis, and a depth direction in the drawing is a Z-axis. However, this coordinate axis is only required for convenience in the explanation of the embodiment, and has no relation to the present invention. When a topology other than the topology having the three-dimensional lattice, such as a tree-shaped topology, is used, the topology is expressed by the number of steps of the tree, etc. apart from the coordinate axis. In the three-dimensional lattice-shaped topology of FIG. 3, when the interaction between the spins is taken as a graph, a five-order spin (peak) at the maximum is required. In consideration of including also the connection of the external magnetic field coefficient, note that the order is required to be six at the maximum.

In one spin unit 300 shown in FIG. 3, values of adjacent spins (in a case of, for example, adjacent five spins) $\sigma_j$, $\sigma_k$, $\sigma_l$, $\sigma_m$, and $\sigma_n$ are inputted. Also, in addition to the spin $\sigma_i$ and the external magnetic field coefficient $h_i$, the spin unit 300 has a memory cell for storing $J_{j,i}$, $J_{k,i}$, $J_{l,i}$, $J_{m,i}$, $J_{n,i}$, which are interaction coefficients with the above-described adjacent spin $\sigma_i$ (interaction coefficients with the adjacent five spins).

Incidentally, the Ising model has an interaction generally expressed by an undirected graph. The above-described formula (1) includes "$J_{i,j} \times \sigma_i \times \sigma_j$" as a term indicating the interaction, and this term indicates the interaction caused from the i-th spin to the j-th spin. At this time, in the general Ising model, the interaction caused from the i-th spin to the j-th spin is not distinguished from the interaction caused from the j-th spin to the i-th spin. That is, "$J_{i,j}$" and "$J_{j,i}$" are the same as each other. However, in the Ising chip 100 of the present embodiment, the interaction caused from the i-th spin to the j-th spin and the interaction caused from the j-th spin to the i-th spin are made asymmetric to each other by expanding this Ising model so as to have a directed graph. In this manner, an expression ability of the model increases, so that many problems can be expressed by a smaller-scale model.

Therefore, when one spin unit 300 is considered to be the i-th spin $\sigma_i$, the interaction coefficients $J_{j,i}$, $J_{k,i}$, $J_{l,i}$, $J_{m,i}$, $J_{n,i}$, which are the interaction coefficients stored in this spin unit determine the interaction caused from the j-th, k-th, l-th, m-th and n-th adjacent spins $\sigma_j$, $\sigma_k$, $\sigma_l$, $\sigma_m$, and $\sigma_n$, to the i-th spin $\sigma_i$. This corresponds to the fact that an arrow (interaction) corresponded from the interaction coefficient stored in the spin unit 300 is directed from a spin outside the shown spin unit 300 to a spin inside the spin unit 300 in FIG. 3.

Although details will be described later, in the present embodiment, a topology to which not only the value of the adjacent spin but also a value of a distant spin are inputted is achieved in one spin unit 300. This topology is achieved by coupling or dividing the adjacent or distant spin units 300 in the interaction among a plurality of spin units 300 in the Ising chip 100.

<5. Configuration of Spin Unit>

Figure 7:
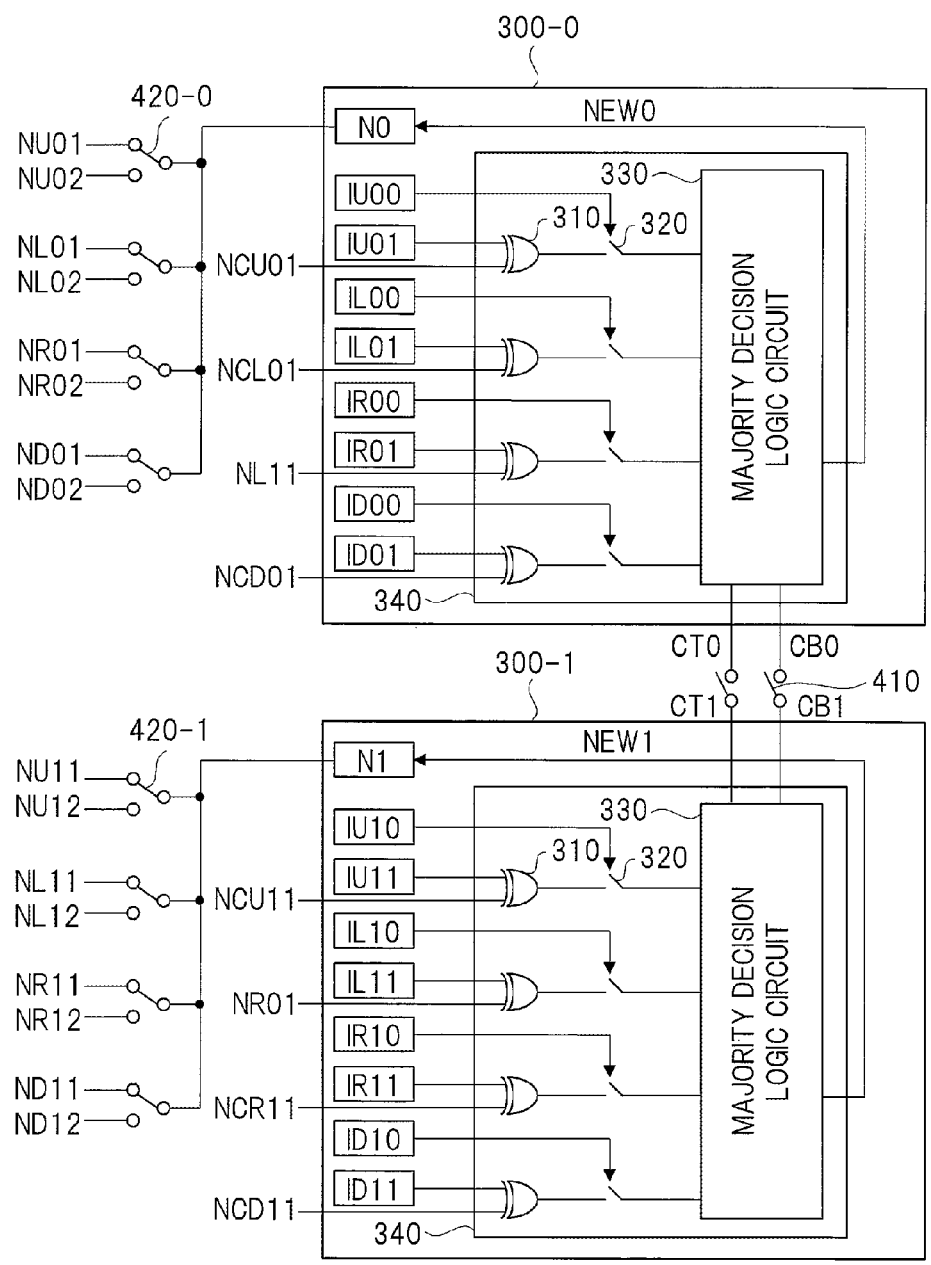
FIG. 7 is a diagram for explaining an example of a circuit configuration (outlet-side switch) for coupling two spin units in the spin array of the Ising chip of FIG. 1.

A configuration example of the spin unit 300 will be explained by using FIG. 7. While FIG. 7 shows two spin units 300-0 and 300-1., the explanation here will be made by typically using one spin unit 300-0. A configuration of the spin unit 300 is also similar in FIG. 8.

In order to store the spin $\sigma_i$ of the Ising model, the interaction coefficient $J_{j,i}$ to $J_{n,i}$ and the external magnetic field coefficient $h_i$, the spin unit 300-0 has a plurality of 1-bit memory cells N0, IS00 (omitted in the drawing), IS01 (omitted in the drawing), IU00, IU01, IL00, IL01, IR00, IR01, ID00, IDO1, IF00 (omitted in the drawing), and IF01 (omitted in the drawing). Note that the memory cells IS00 and IS01 omitted in the drawing, the memory cells IU00 and IU01, the memory cells IL00 and IL01, the memory cells IR00 and IR01, the memory cells ID00 and ID01, and the memory cells IF00 and IF01 omitted in the drawing play a role as a pair of two memory cells, respectively, and therefore, they are collectively abbreviated as a memory cell pair ISx, IUx, ILx, IRx, IDx or IFx, respectively (see FIG. 4). The following will be the explanation also including the memory cells omitted in the drawing.

Each of memory cells N0, IS00, IS01, IU00, IU01, IL00, IL01, IR00, IR01, ID00, ID01, IF00 and IF01, which are included in the spin unit 300-0, has a data storing unit configured of two CMOS inverters as similar to the SRAM although not shown, and pass gate transistors each connected to the both ends of the data storing unit are controlled by a word line and a bit line, so that data reading/writing from/to the data storing unit are achieved.

Here, the explanation will be made based on the assumption that the spin unit 300-0 expresses the i-th spin. The memory cell N0 is a memory cell for expressing the spin $\sigma_i$, and stores a value of the spin. In the Ising model, the values of the spin are +1/−1 (+1 is also expressed as upside, and −1 is also expressed as downside), and the values are corresponded to 0/1 which are two values of the memory cell. For example, +1 is corresponded to 1, and −1 is corresponded to 0.

Figure 4:
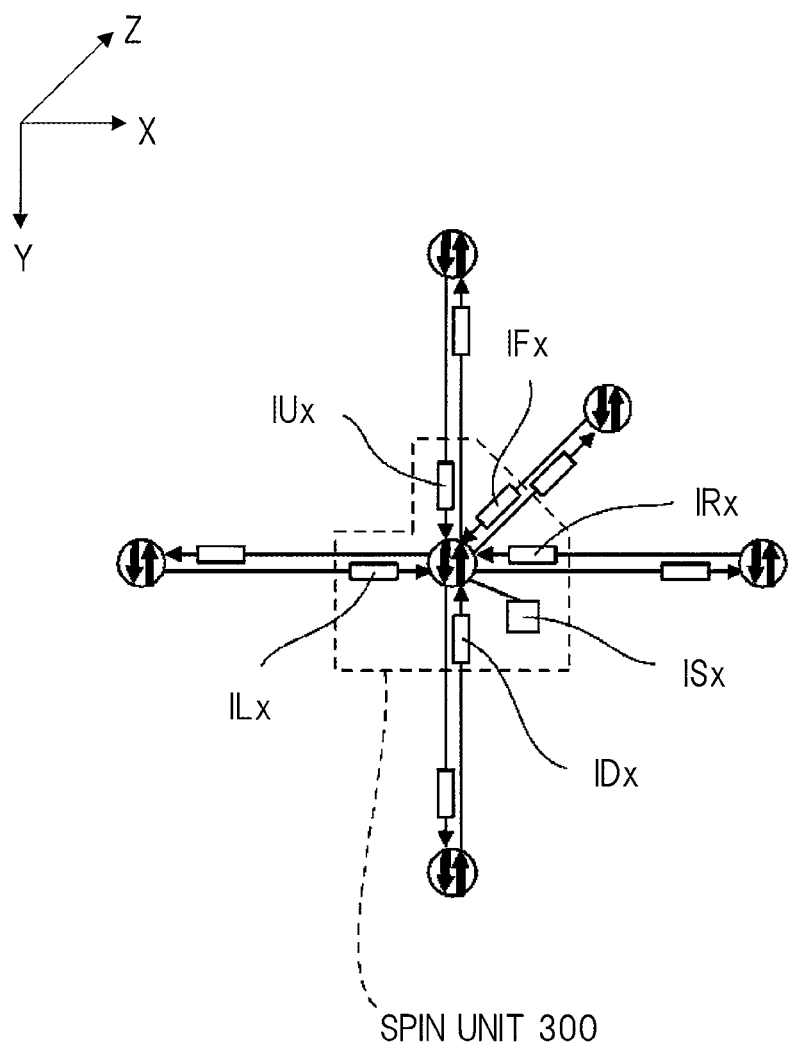
FIG. 4 is a diagram for explaining an example of a correspondence relation between a topology of the spin array and a memory cell in a spin unit in an embodiment of the present invention.

By using FIG. 4, an example of correspondence relations between the memory cell pairs ISx, IUx, ILx, IRx, IDx and IFx which are included in the spin unit 300-0 and the topology of the Ising model shown in FIG. 3 are shown. The memory cell pair ISx stores an external magnetic field coefficient. In addition, each of the memory cell pairs IUx, ILx IRx, IDx and IFx stores an interaction coefficient. Specifically, the memory cell pairs IUx, ILx, IRx, IDx, and IFx stores interaction coefficients $J_{i,j}$ with an upside spin (−1 in the Y-axis direction), a left-side spin (−1 in the X-axis direction), a right-side spin (+1 in the X-axis direction), a downside spin (+1 in the Y-axis direction), and a depth-direction coupled spin (+1 or −1 in the Z-axis direction), respectively.

In addition, in the case of taking the Ising model as the directed graph, when viewed from a certain spin, other spin has a coefficient having the influence on the own spin. The coefficient of the influence of the own spin on other spin belongs to the other spin. That is, this spin unit 300-0 is coupled with five spins at the maximum. In the Ising chip 100 of the present embodiment, three values of +1/0/−1 correspond to the external magnetic field coefficient and the interaction coefficient. Therefore, in order to express the external magnetic field coefficient and the interaction coefficient, each of them requires a memory cell of 2 bits. For the memory cell pairs ISx, IUx, ILx, IRx, IDx and IFx, the three values of +1/0/−1 are expressed by a combination of two memory cells each of which has a last number of 00 or 01 (for example, memory cells IS00 and IS01 in the case of the memory cell pair ISx).

For example, for the memory cell pair ISx, +1/−1 is expressed by the memory cell IS01 so that +1 is expressed when the value stored in the memory cell IS01 is 1, and −1 is expressed when the value stored in the memory cell IS01 is 0. In addition to this, the external magnetic field coefficient is regarded as 0 when the value stored in the memory cell IS00 is 0, or either of +1/−1 determined by the value stored in the memory cell IS01 is set to the external magnetic field coefficient when the value stored in the memory cell IS00 is 1. If the case of the external magnetic field coefficient of 0 is considered to disable the external magnetic field coefficient, it can be said that the value stored in the memory cell IS00 is an enabling bit of the external magnetic field coefficient (when IS00=1, the external magnetic field coefficient is enabled). Also for the memory cell pairs IUx, ILx, IRx, IDx and IFx which store the interaction coefficients, the coefficients and the bit values are corresponded to each other.

Each of the memory cells N0, IS00, IS01, IU00, IU01, IL00, IL01, IR00, IR01, ID00, ID01, IF00 and IF01 in the spin unit 300-0 has to be capable of reading/writing from/to the outside of the Ising chip 100. Therefore, the spin unit 300-0 has each of a bit line and a word line not shown. The spin units 300-0 are arranged in a tiled pattern on a semiconductor substrate, and are driven, controlled or read by the I/O address decoder 130 and I/O driver 120 shown in FIG. 1 with connecting the bit line and the word line, so that the memory cells in the spin unit 300-0 can be read/written by the SRAM-compatible interface 150 of the Ising chip 100 as similar to a general SRAM (Static Random Access Memory).

Figure 8:
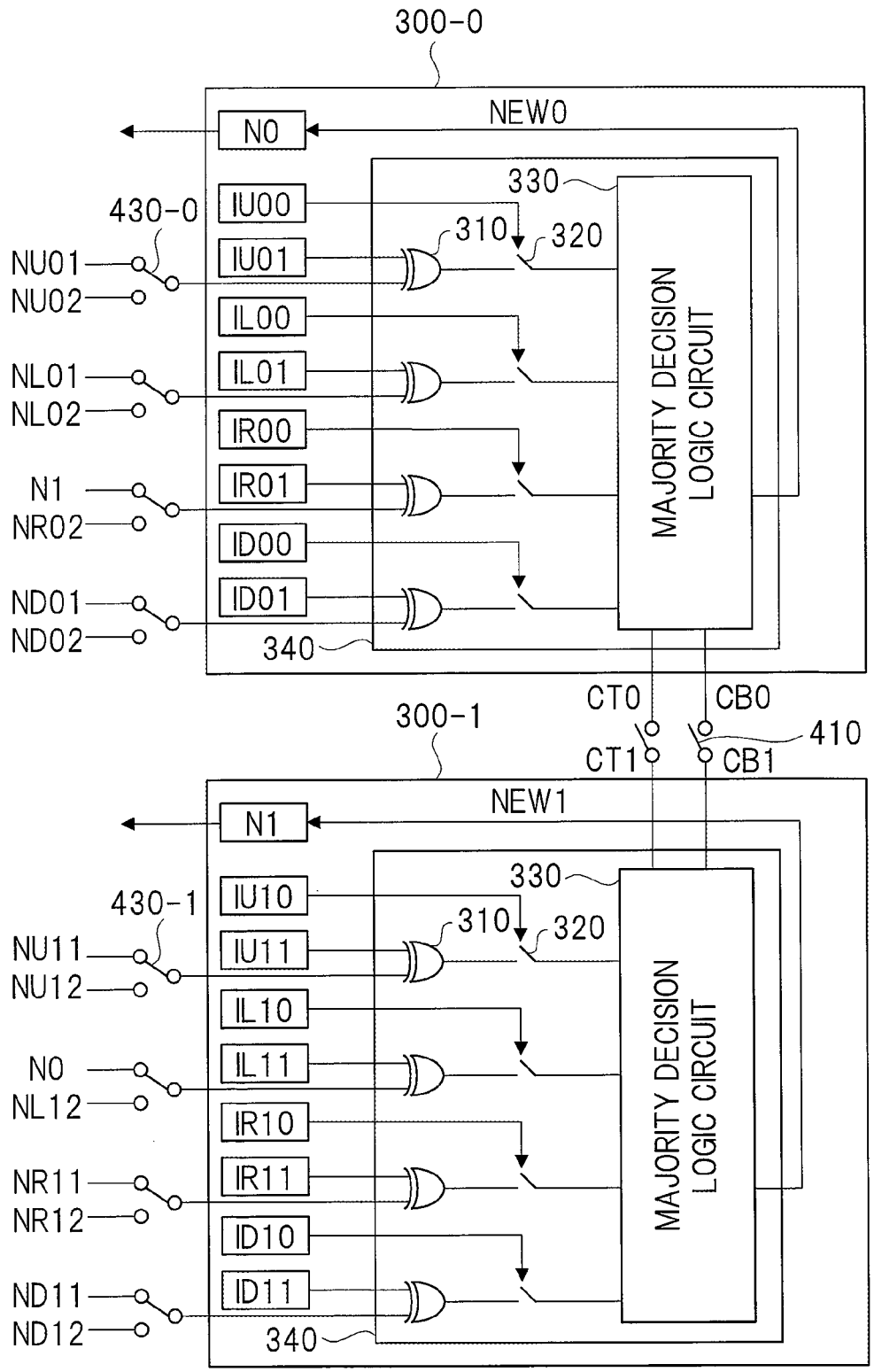
FIG. 8 is a diagram for explaining an example of a circuit configuration (inlet-side switch) for coupling two spin units in the spin array of the Ising chip of FIG. 1.

Note that a configuration of other spin unit 300-1 shown in FIGS. 7 and 8 is also the same. The other spin unit 300-1 has a plurality of 1-bit memory cells N1, IS10 (omitted in the drawing), IS11 (omitted in the drawing), IU10, IU11, IL10, IL11, IR10, IR11, ID10, ID11, IF10 (omitted in the drawing) and IF11 (omitted in the drawing).

<6. Circuit for Determining Next State of Spin in Spin Unit>

In the spin unit 300, in order to perform updating simultaneously, every spin unit 300 independently has a circuit for determining a next spin state by calculating the interaction. The circuit for determining the next state of the spin is shown in FIG. 7. While FIG. 7 shows two spin units 300-0 and 300-1, the explanation will be typically made here by using one spin unit 300-0.

In FIG. 7, the one spin unit 300-0 has signal lines NCU01, NCL01, NL11, NCD01, NCF01 (omitted in the drawing) and N0 as interfaces with the outside. Hereinafter, the explanation will be made so as to also include the signal lines omitted in the drawing.

The signal line N0 is an interface to output a value of the spin of this spin unit 300-0 to other spin unit 300. The signal lines NCU01, NCL01, NL11, NCD01 and NCF01 are interfaces each of which inputs a value of a spin stored in other spin unit 300. The signal line NCU01 takes an input from a distant upside spin (−1 in the Y-axis direction), the signal line NCL01 takes an input from a distant left-side spin (−1 in the X-axis direction), the signal line NL11 takes an input from an adjacent left-side spin (−1 in the X-axis direction), the signal line NCD01 takes an input from a distant downside spin (+1 in the Y-axis direction), and the signal line NCF01 takes an input from a distant depth-direction coupled spin (+1 or −1 in the Z-axis direction).

Note that the other spin unit 300-1 has signal lines NCU11, NR01, NCR11, NCD11, NCF11 (omitted in the drawing) and N1 as interfaces with the outside. The signal line NCU11 takes an input from a distant upside spin (−1 in the Y-axis direction), and the signal line NR01 takes an input from an adjacent right-side spin (+1 in the X-axis direction), and the signal line NCR11 takes an input from a distant right-side spin (+1 in the X-axis direction), and the signal line NCD11 is an input from a distant downside spin (+1 in the Y-axis direction), and the signal line NCF11 takes an input from a distant depth-direction coupled spin (+1 or −1 in the Z-axis direction).

For these interfaces, it is required to determine handling of an edge in consideration of the topology of the Ising model. If the edge is simply cut off as similar to the topology of FIG. 3, it is not required to input anything to the signal line corresponding to the edge among the signal lines NCU01, NCL01, NL11, NCD01 and NCF01 (on the circuit, such a suitable handling as using an unused input terminal by connection to a fixed value of 0 or 1 is taken).

In the spin unit 300-0, the next state of the spin is determined so as to minimize energy with the adjacent or distant spin, and this determination is equivalent to the determination of which one of a positive value and a negative value is dominant when a product between the adjacent or distant spin and the interaction coefficient and the external magnetic field coefficient are observed. For example, when the spin: $\sigma_j$, $\sigma_k$, $\sigma_l$, $\sigma_m$ and $\sigma_n$ are adjacent to or distant from the i-th spin $\sigma_i$, the next state of the spin $\sigma_i$ is determined as follows. First, it is assumed that the values of the adjacent or distant spins are expressed as $\sigma_j=+1$, $\sigma_k=-1$, $\sigma_l=+1$, $\sigma_m=-1$ and $\sigma_n=+1$, and that the interaction coefficients are expressed as $J_{j,i}=+1$, $J_{k,i}=+1$, $J_{l,i}=+1$, $J_{m,i}=-1$ and $J_{n,i}=-1$, and that the external magnetic field coefficient is expressed as $h_i=+1$. At this time, when each of the product between the interaction coefficient and the adjacent or distant spin, and the external magnetic field coefficient is arranged, they are expressed as $\sigma_j \times J_{j,i}=+1$, $\sigma_k \times J_{k,i}=-1$, $\sigma_l \times J_{l,i}=+1$, $\sigma_m \times J_{m,i}=+1$, $\sigma_n \times J_{n,i}=-1$, and $h_i=+1$. The external magnetic field coefficient may be interpreted as an interaction coefficient with a spin whose value is always +1.

Here, a local energy between the i-th spin and the adjacent or distant spin becomes a value obtained by multiplying the value of the i-th spin with the above-described coefficient, and besides, by inverting a sign. For example, a local energy between the i-th spin and the j-th spin becomes −1 when the i-th spin is +1, and becomes +1 when the i-th spin is −1, and therefore, the setting of the i-th spin to be +1 acts in a direction of decrease in the local energy here. When such a local energy between the i-th spin and all the adjacent or distant spins and with respect to the external magnetic field coefficient is considered, the calculation is performed for which one of +1 and −1 as the value of the i-th spin can decrease the energy. This calculation is performed by counting which one of +1 and −1 is more than the other in the arrangement of each of the above-described product between the interaction coefficient and the adjacent or distant spin and the external magnetic field coefficient. In the above-described example, the number of +1 is 4, and the number of −1 is 2. The sum total of the energy becomes −2 if the i-th spin is +1, and the sum total of the energy becomes +2 if the i-th spin is −1. Therefore, such a next state of the i-th spin as minimizing the energy can be determined by majority decision that the next state of the i-th spin is set to +1 if the number of +1 is larger, and the next state of the i-th spin is set to −1 if the number of −1 is larger.

A logic circuit shown in the spin unit 300-0 of FIG. 7 is a circuit for calculating the interaction described above. First, an exclusive disjunction (OR) operation of the state of the adjacent or distant spin and the value stored in each of the memory cells IU01, IL01, IR01, ID01 and IF01 (omitted in the drawing) which indicate +1/−1 of the interaction coefficient is obtained by an exclusive OR circuit 310. In this manner, when only the interaction is seen, the next state of the spin which minimizes the energy can be calculated (it is assumed that +1 is encoded as 1 and that −1 is encoded as 0). If the interaction coefficient is only +1/−1, the next state of the spin can be determined by judging which one of +1 and −1 of outputs of the exclusive OR circuit 310 is more than the other by the majority decision logic in the majority decision logic circuit 330. When the external magnetic field coefficient is always regarded so as to correspond to the interaction coefficient with the spin of state +1, a value of the external magnetic field coefficient is simply a value to be inputted into the majority decision logic circuit 330 for determining the next state of the spin.

In a configuration of the spin unit 300 (300-0 and 300-1) shown in FIGS. 7 and 8, the exclusive OR circuit 310, a switching circuit 320 and the majority decision logic circuit 330 are referred to as an interaction calculation circuit 340 as a whole.

The ground state of the applied Ising model can be searched by the above-described minimization of the energy caused by the interaction between the spins. However, only this manner has a possibility of falling into a local optimum solution. Basically, there is only a motion in a direction of the decrease in the energy, and therefore, once the search is fallen into the local optimum solution, the solution cannot be got out from that, and the search cannot reach a global optimum solution. Therefore, as action for escaping from the local optimum solution, a method of stochastically inverting the value of the memory cell which expresses the spin is also used.

<7. Coupling or Separation of Plurality of Spin Unit in Ising Chip>

In the present embodiment, in order to achieve a topology in which not only the value of the adjacent spin but also the value of the distant spin is inputted to one spin unit 300, interaction between a plurality of spin units 300 in the Ising chip 100 has a configuration in which the adjacent or the distant spin units 300 are coupled or separated.

Figure 5:
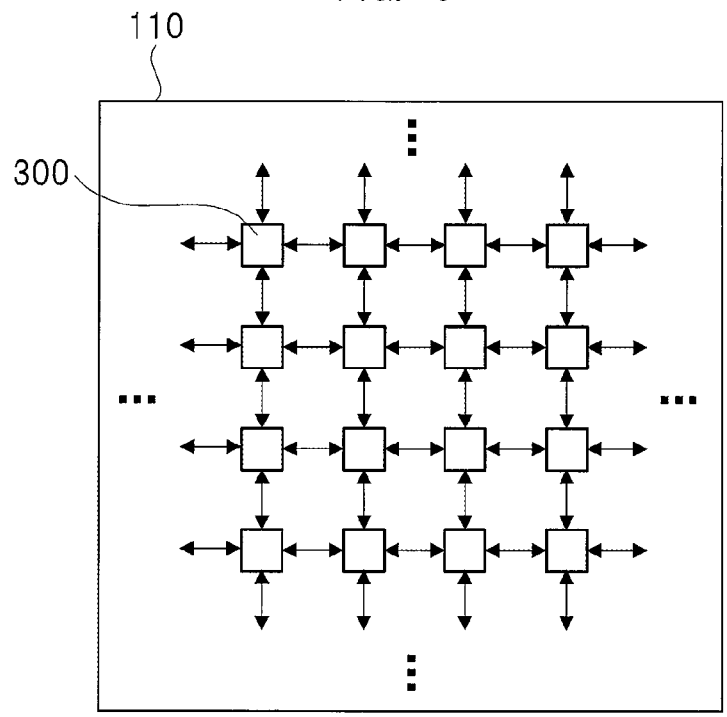
FIG. 5 is a diagram for explaining an example of an interaction caused by a spin unit of the minimum unit in the spin array of the Ising chip of FIG. 1.
Figure 6:
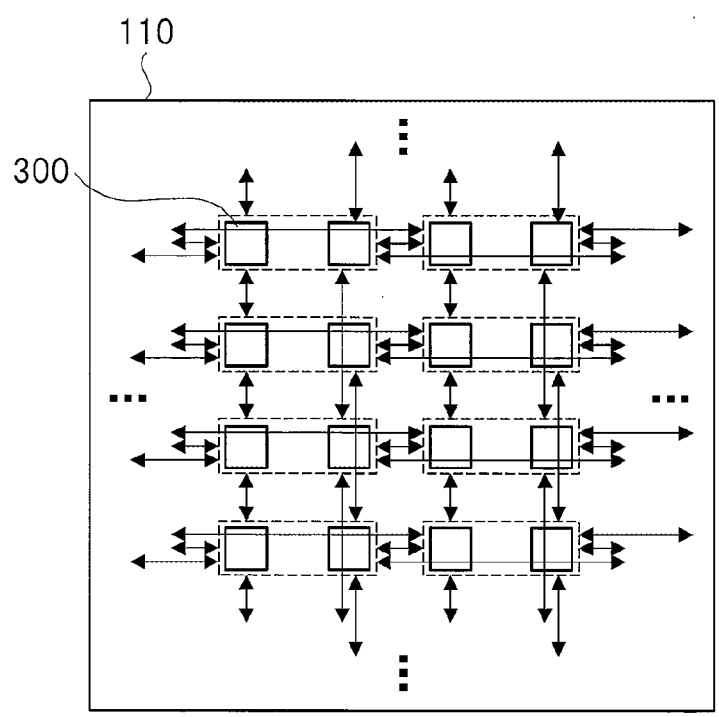
FIG. 6 is a diagram for explaining an example in a case of achieving a complicated topology by coupling two spin units in the spin array of the Ising chip of FIG. 1.

FIG. 5 is a diagram for explaining an example of the interaction based on the spin unit 300 of the smallest unit in the spin array 110. FIG. 6 is a diagram for explaining an example in a case of achieving a complicated topology obtained by coupling two spin units 300 in the spin array 110. FIGS. 5 and 6 show the spin array 110 configured so that a plurality of spin units 300 are arranged and connected in a two-dimensional plane on a semiconductor substrate while maintaining a topology of the Ising model. That is, in the spin array 110, the plurality of spin units 300 each of which is assigned with each spin of the Ising model having the three-dimensional lattice-shaped topology shown in FIG. 3 are arranged and connected in a two-dimensional lattice shape on the semiconductor substrate.

An example of FIG. 5 shows a case of the separation of the plurality of spin units 300 so that each spin unit 300 can be coupled with the adjacent spin unit. Specifically, when attention is focused on one certain spin unit 300, this spin unit can be coupled with each of the upside spin unit, the left-side spin unit, the right-side spin unit and the downside spin unit. More details will be described later by using FIG. 9.

On the other hand, an example of FIG. 6 shows a case of the coupling of the plurality of spin units 300 so that two spin units 300 are coupled with each other to be regarded as one spin unit (the configuration unit regarded as one spin unit is referred to as a pair of spin units), and can be coupled with the adjacent spin unit 300 and distant spin unit 300. Specifically, when attention is focused on a certain pair of spin units 300, the adjacent spin unit coupled with this pair of spin units is the same as that in the case of FIG. 5. That is, this pair of spin units 300 can be coupled with each of the upside spin unit, the left-side spin unit, the right-side spin unit and the downside spin unit. In addition to the adjacent spin units, this pair of spin units 300 can be also coupled with each of the distant upside spin unit, the distant left-side spin unit, the distant right-side spin unit and the distant downside spin unit. The more details will be described later by using FIG. 10.

Note that FIG. 6 shows an example of coupling of two spin units lined in a row direction. However, the present embodiment is similarly applicable to a case of coupling of two spin units lined in a column direction. Furthermore, cases of coupling of not only two but also three or more spin units are included in the scope of the present invention.

<8. Circuit Configuration for Coupling Two Spin Unit>

FIGS. 7 and 8 are diagrams for explaining an example of a circuit configuration for coupling the two spin units 300. FIG. 7 shows an example of control of the topology on a data outlet side by inserting a switch into a part at which the value of the spin is distributed (outputted) to the memory cell of the adjacent or distant spin unit 300. FIG. 8 shows an example of control of the topology on a data inlet side by inserting a switch into a part at which the value of the spin is inputted from the memory cell of the adjacent or distant spin unit 300.

In order to achieve the pair of spin units by coupling the two spin units 300, first of all, a switch 410 for coupling or separating the adjacent or distant spin units 300-0 and 300-1 is provided as illustrated in FIGS. 7 and 8. This switch 410 is connected between signal lines CT0 and CB0 of the majority decision logic circuit 330 of one spin unit 300-0 and signal lines CT1 and CB1 of the majority decision logic circuit 330 of the other spin unit 300-1, and the signal lines are connected to each other so as to couple the two spin units when being turned ON, and the signal lines are disconnected to each other so as to separate the two spin units when being turned OFF.

The case of the coupling of the two spin units 300-0 and 300-1 can achieve the majority decision logic operation based on more spin values than the case of the separation of the two spin units, and therefore, this case can handle the calculation for more complicated problems.

Further, in order to achieve the pair of spin units by coupling the two spin units 300, secondly, a switch 420 inserted into a part at which the value of the spin is distributed to the adjacent or distant spin unit 300 as illustrated in FIG. 7 or a switch 430 inserted into a part at which the value of the spin is inputted from the adjacent or distant spin unit 300 as illustrated in FIG. 8 is provided. The switch 420 is a switch which can take a plurality of (two in the example of FIG. 7) outputs for one input, and the switch 430 is a switch which can take one output for a plurality of (two in the example of FIG. 8) inputs. Note that the invention is also applicable to a configuration which has both switch 420 and switch 430.

In the example of FIG. 7, in one spin unit 300-0, by switching the switch 420-0 to one side (a state of FIG. 7), the value of the spin of the memory cell N0 can be distributed to each of the upside spin unit (NU01), the left-side spin unit (NL01), the right-side spin unit (NR01) and the downside spin unit (ND01). Also, by switching the switch 420-0 to the other side, the value of the spin of the memory cell N0 can be distributed to each of the upside spin unit (NU02), the left-side spin unit (NL02), the right-side spin unit (NR02) and the downside spin unit (ND02).

Similarly, in the other spin unit 300-1, by switching the switch 420-1 to one side (a state of FIG. 7), the value of the spin of the memory cell N1 can be distributed to each of the upside spin unit (NU11), the left-side spin unit (NL11), the right-side spin unit (NR11) and the downside spin unit (ND11). Also, by switching the switch 420-1 to the other side, the value of the spin of the memory cell N1 can be distributed to each of the upside spin unit (NU12), the left-side spin unit (NL12), the right-side spin unit (NR12) and the downside spin unit (ND12).

When two spin units 300-0 and 300-1 are coupled (when the switch 410 is turned ON), memory cells N0 and N1 have the same values, so that a value of spins can be distributed to more spin units by switching the switches 420-0 and 420-1. In this case, in a spin unit which can distribute a value of a spin, the value of the spin can be distributed to not only the adjacent spin unit but also the distant spin unit, and therefore, this case can handle the calculation for more complicated problems.

In an example of FIG. 8, in one spin unit 300-0, by switching the switch 430-0 to one side (a state of FIG. 8), each spin value of the upside spin unit (NU01), the left-side spin unit (NL01), the other-side spin unit (N1) and the downside spin unit (ND01) can be inputted into each exclusive OR circuit 310 of the one spin unit 300-0. In addition, by switching the switch 430-0 to the other side, each spin value of the upside spin unit (NU02), the left-side spin unit (NL02), the right-side spin unit (NR02) and the downside spin unit (ND02) can be inputted into each exclusive OR circuit 310 of the one spin unit 300-0.

Similarly, in the other spin unit 300-1, by switching the switch 430-1 to one side (a state of FIG. 8), each spin value of the upside spin unit (NU11), the one spin unit (N0), the right-side spin unit (NR11) and the downside spin unit (ND11) can be inputted into each exclusive OR circuit 310 of the other spin unit 300-1. In addition, by switching the switch 430-1 to the other side, each spin value of the upside spin unit (NU12), the left-side spin unit (NL12), the right-side spin unit (NR12) and the downside spin unit (ND12) can be inputted into each exclusive OR circuit 310 of the other spin unit 300-1.

When two spin units 300-0 and 300-1 are coupled (when the switch 410 is turned ON), a spin value can be inputted from more spin units by switching the switches 430-0 and 430-1. In this case, in a spin unit which can input the value of the spin, the value of the spin can be inputted from not only the adjacent spin unit but also the distant spin unit, and therefore, this case can handle the calculation for more complicated problems.

Note that, in the spin unit 300 (300-0 and 300-1) of FIGS. 7 and 8, illustration of the memory cell pairs ISx (IS00 and IS01, and IS10 and IS11) and IFx (IF00 and IF01, and IF10 and IF11) is omitted. The memory cell pair IFx is controlled by switching of a switch as similar to the above-described memory cell pairs IUx, ILx, IRx and IDx. On the other hand, the memory cell pair ISx is a memory cell which stores an external magnetic field coefficient, and therefore, has no switching by a switch.

<9. Coupling of Spin Unit>

Figure 9:
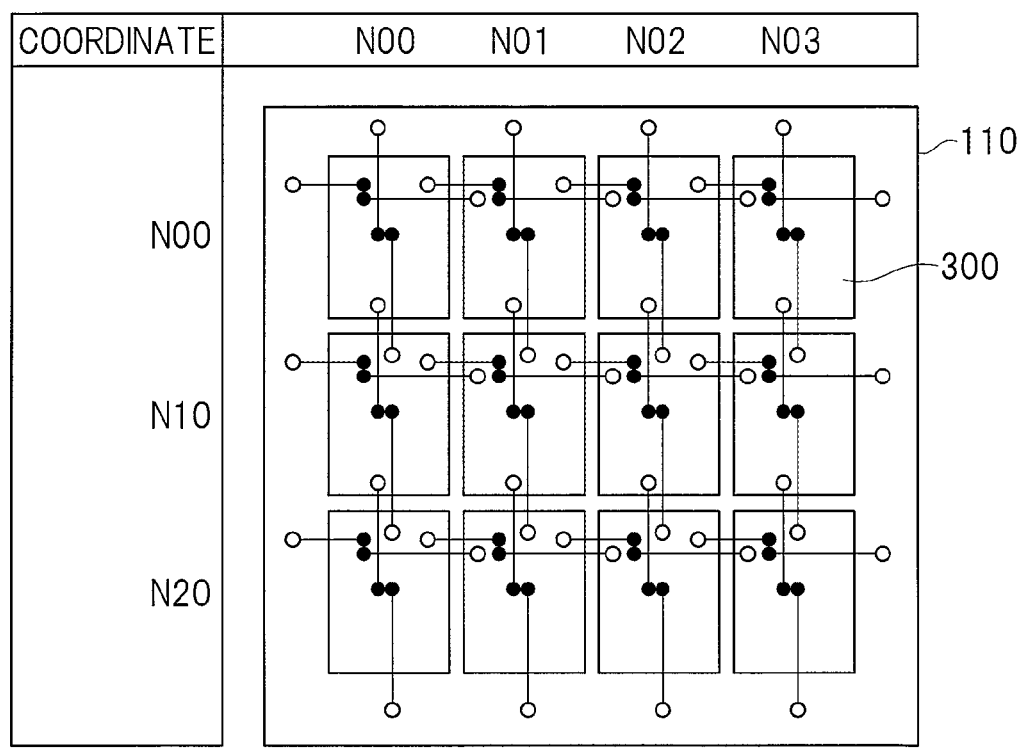
FIG. 9 is a diagram for explaining an example of the coupling of each spin unit in FIG. 5 in the spin array of the Ising chip of FIG. 1.
Figure 10:
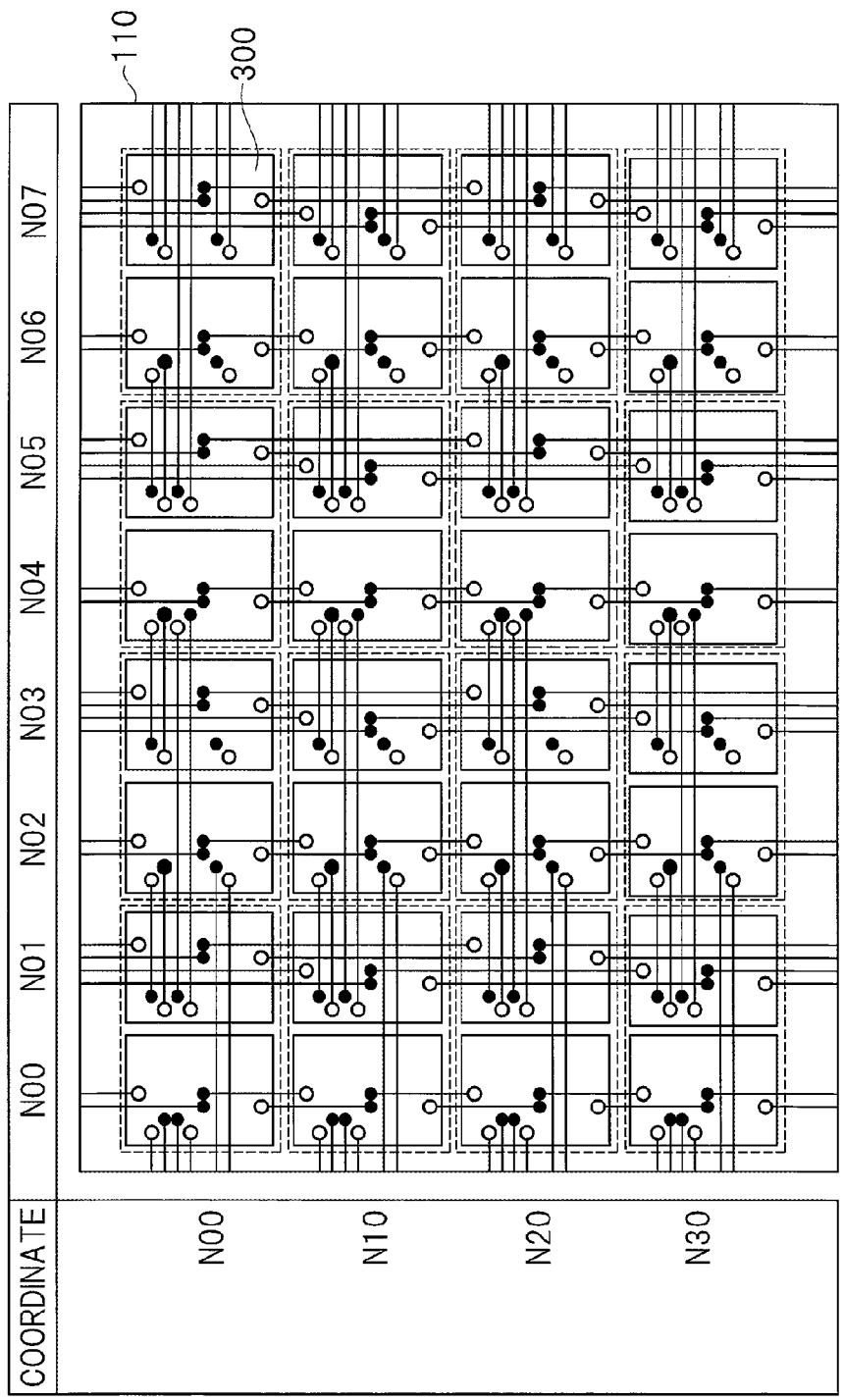
FIG. 10 is a diagram for explaining an example of the coupling of each spin unit in FIG. 6 in the spin array of the Ising chip of FIG. 1.

FIGS. 9 and 10 are diagrams for explaining an example of coupling of each spin unit 300. FIG. 9 shows an example of coupling of each spin unit 300 in FIG. 5 described above, and shows a case in which a plurality of spin units 300 are separated, and one of each spin unit is operated singularly. FIG. 10 shows an example of coupling of each spin unit 300 in FIG. 6 described above, and shows a case in which a plurality of spin units 300 are coupled, and two spin units are coupled and operated. In FIGS. 9 and 10, a black circle (●) denotes an outlet and a white circle (○) denotes an inlet.

As the plurality of spin units 300, FIG. 9 shows an example in which four spin units are arranged in the row direction and three spin units are arranged in the column direction in a two-dimensional lattice shape. For distinguishing each spin unit 300, coordinates (N00, N01, N02 and N03 in the row direction, and N00, N10 and N20 in the column direction) are provided for convenience in the explanation. For example, a coupling relation will be described while attention is focused on the spin unit 300 of N11. The outlets (●) of this spin unit (N11) are connected to the upside spin unit (N01), the left-side spin unit (N10), the right-side spin unit (N12) and the downside spin unit (N21), respectively. In addition, the inlets (○) of this spin unit (N11) are connected to the upside spin unit (N01), the left-side spin unit (N10), the right-side spin unit (N12) and the downside spin unit (N21), respectively.

The same goes for when attention is focused on a spin unit 300 having other coordinate. As described above, each spin unit 300 is coupled to the adjacent spin unit 300. However, for example, when attention is focused on the spin unit 300 of N00, the spin unit does not have upside and left-side spin units 300, and therefore, the spin unit is suitably handled as an unused input/output terminal so as to be connected to a fixed value of 0 or 1 on a circuit. The same goes for a case of no other opposite-side (adjacent upside, adjacent left-side, adjacent right-side, adjacent downside and a combination thereof) spin unit 300.

As a plurality of spin units 300, FIG. 10 shows an example in which eight spin units are arranged in the row direction and four spin units are arranged in the column direction in a two-dimensional lattice shape. For distinguishing each spin unit 300, coordinates (N00, N01, N02, N03, N04, N05, N06 and N07 in the row direction, and N00, N10, N20 and N30 in the column direction) are provided for convenience in the explanation. In addition, in FIG. 10, every two spin units 300 in the row direction are connected to form a pair of spin units (shown with a rectangle of a dashed line). The pair of spin units is a configuration unit regarded as one spin unit.

For example, a connection relation will be described while attention is focused on a pair of spin units formed by connecting the spin unit 300 of N24 and the spin unit 300 of N25. For example, when attention is focused on the spin unit 300 of N24 of the pair of the spin units, outlets (●) of this spin unit (N24) are connected to the upside spin unit (N14), the left-side spin unit (N23), the distant left-side spin unit (N21), and the downside spin unit (N34), respectively. When attention is focused on the spin unit 300 of N25 of the pair of the spin units, outlets (●) of this spin unit (N25) are connected to the distant upside spin unit (N05), the right-side spin unit (N26), the distant right-side spin unit (outside illustration area (N28)) and the distant downside spin unit (outside illustration area (N45)), respectively.

In addition, when attention is focused on the spin unit 300 of N24 of the pair of the spin units, inlets (○) of this spin unit (N24) are connected to the upside spin unit (N14), the left-side spin unit (N23), the distant left-side spin unit (N21) and the downside spin unit (N34), respectively. When attention is focused on the spin unit 300 of N25 of the pair of the spin units, inlets (○) of this spin unit (N25) are connected to the distant upside spin unit (N05), the right-side spin unit (N26), the distant right-side spin unit (outside illustration area (N28)), and the distant downside spin unit (outside illustration area (N45)), respectively.

In addition, the same goes for a pair of spin units having other coordinate. As described above, a pair of spin units formed by connecting every two spin units 300 are connected to the adjacent spin unit 300 and distant spin unit 300. However, for example, when attention is focused on the spin unit 300 of N00 of a pair of spin units, the spin unit does not have upside and left-side spin units 300, and therefore, is suitably handled as an unused input/output terminal so as to be connected to a fixed value of 0 or 1 on a circuit. The same goes for a case of no other opposite-side (adjacent upside, adjacent left-side, adjacent right-side, adjacent downside, distant upside, distant left-side, distant right-side, distant downside and a combination thereof) spin units 300.

As described above, a pair of spin units are connected to not only the adjacent spin unit but also the distant spin unit. In the example of FIG. 10, when the adjacent spin unit is assumed to be the first spin unit, note that the distant spin unit indicates the third spin unit. However, in the present embodiment, the distant spin unit is applicable also to a fourth or farther spin unit.

<10. Switch Arrangement>

Figure 11:
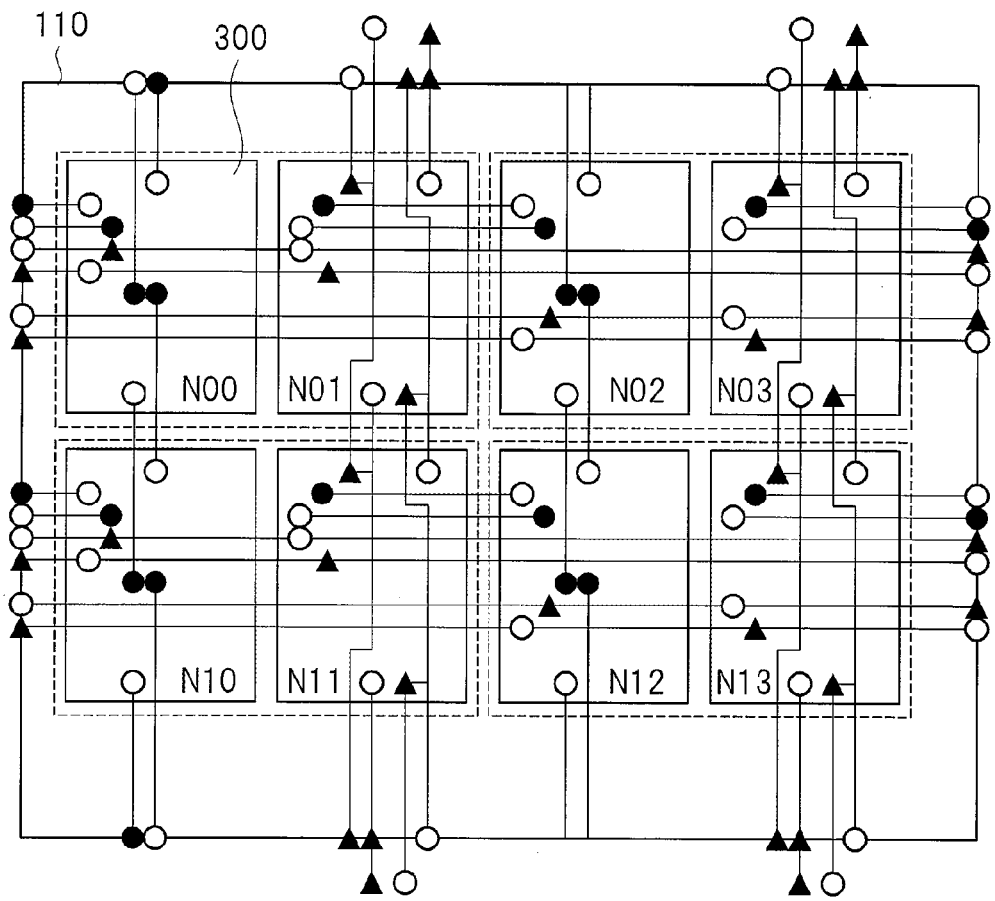
FIG. 11 is a diagram for explaining an example of a configuration (corresponding to FIG. 7) for switching between and using FIG. 9 and FIG. 10 in the spin array of the Ising chip of FIG. 1.
Figure 12:
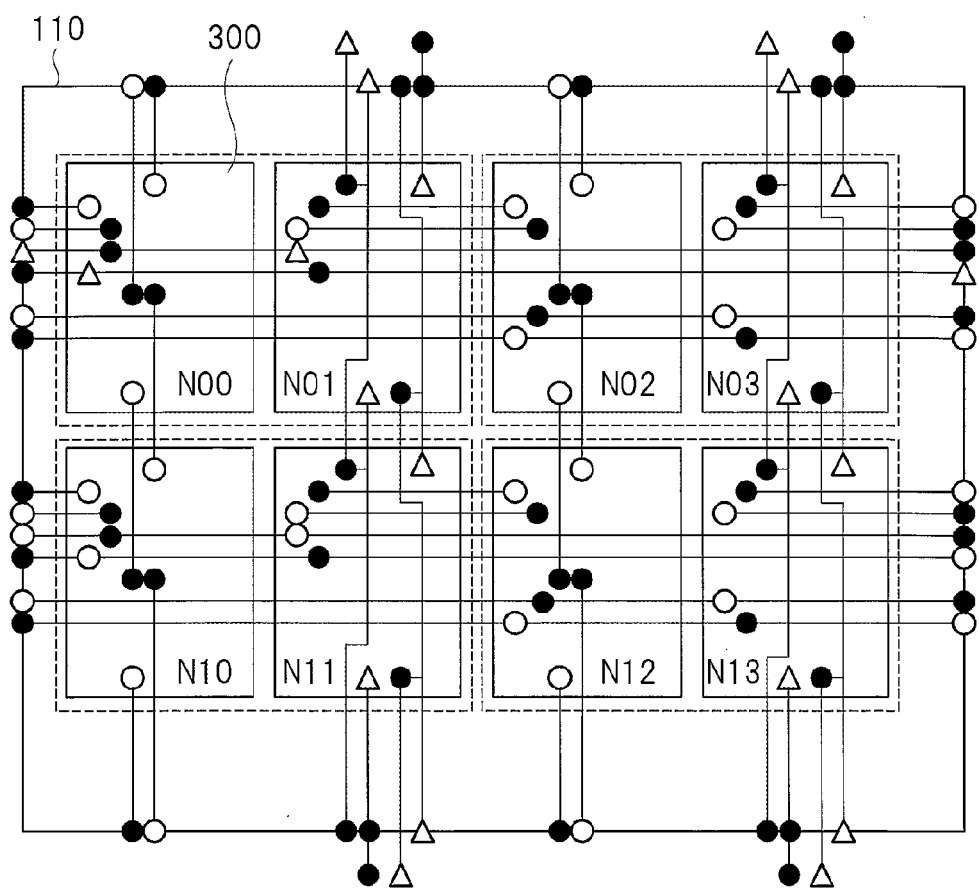
FIG. 12 is a diagram for explaining an example of a configuration (corresponding to FIG. 8) for switching between and using FIG. 9 and FIG. 10 in the spin array of the Ising chip of FIG. 1.

FIGS. 11 and 12 are diagrams for explaining an example of a configuration in which the FIG. 9 (the case with one of each spin unit 300 operating singularly) and FIG. 10 (the case with two spin units 300 connected and operated) described above are switched and used. FIG. 11*i* shows an example of switch arrangement corresponding to FIG. 7 described above (the case of insertion of the switch 420 into a part at which the value of the spin is distributed to the memory cell of the adjacent or distant spin unit 300). FIG. 12 shows an example of switch arrangement corresponding to FIG. 8 described above (the case of insertion of the switch 430 into a part at which the value of the spin is inputted from the memory cell of the adjacent or distant spin unit 300). In FIGS. 11 and 12, a black circle (●) denotes an outlet, a white circle (○) denotes an inlet, and a black triangle (▲) denotes an outlet with the switch, and a white triangle (Δ) denotes an inlet with the switch.

FIG. 11 shows an example in which four spin units are arranged in the row direction and two spin units are arranged in the column direction in a two-dimensional lattice shape as a plurality of spin units 300. For distinguishing each spin unit 300, coordinates (N00, N01, N02 and N03 in the row direction, and N00 and N10 in the column direction) are provided for convenience in the explanation. In addition, in FIG. 11, every 2 spin units 300 in the row direction are connected to form a pair of spin units.

For example, while attention is focused on a pair of spin units to which the spin unit 300 of N00 and the spin unit 300 of N01 are connected, the outlet with the switch will be explained. For example, when attention is focused on the spin unit 300 of N00 of the pair of spin units, the outlet (▲) with the switch of this spin unit (N00) is an outlet to the distant left-side spin unit among outlets to the adjacent upside spin unit, the adjacent left-side spin unit, the distant left-side spin unit and the adjacent downside spin unit. When attention is focused on the spin unit 300 of N01 of the pair of spin units, outlets (▲) with the switch of this spin unit (N01) among outlets to the distant upside spin unit, the adjacent right-side spin unit, the distant right-side spin unit and the distant downside spin unit are the outlets to the distant upside spin unit, the distant right-side spin unit, and the distant downside spin unit. In addition, the same goes for a pair of spin units having other coordinate.

FIG. 12 also shows a plurality of spin units 300 provided with the coordinates (N00, N01, N02 and N03 in the row direction, and N00 and N10 in the column direction) as similar to those of FIG. 11 in the arrangement of the two-dimensional lattice shape (four spin units in the row directions and two spin units in the column direction) as similar to that of FIG. 11 described above.

For example, the inlet with the switch will be explained while attention is focused on a pair of spin units formed by connecting the spin unit 300 of N00 and the spin unit 300 of N01. For example, when attention is focused on the spin unit 300 of N00 of the pair of spin units, the inlet (Δ) with the switch this spin unit (N00) among inlets from the adjacent upside spin unit, the adjacent left-side spin unit, the distant left-side spin unit and the adjacent downside spin unit is the inlet from the distant left-side spin unit. When attention is focused on the spin unit 300 of N01 of the pair of spin units, the inlets (Δ) with the switch of this spin unit (N01) among inlets from the distant upside spin unit, the adjacent right-side spin unit, the distant right-side spin unit and the distant downside spin unit are the inlet from the distant upside spin unit, the distant right-side spin unit, and the distant downside spin unit. In addition, the same goes for a pair of spin units having other coordinate.

<11. Circuit Configuration of Switch>

Figure 13:
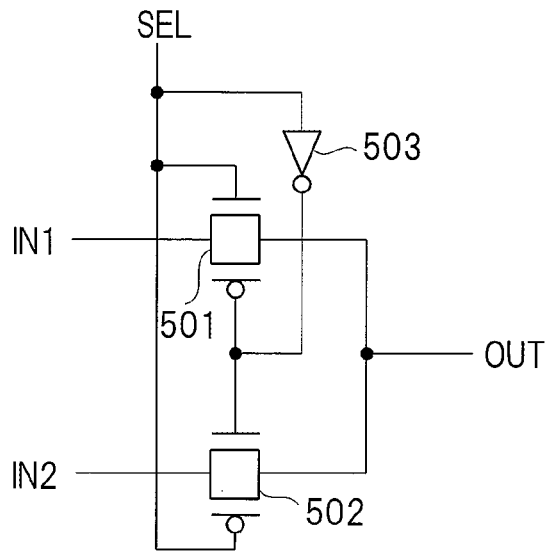
FIG. 13 is a diagram for explaining an example of a circuit configuration of an inlet-side switch of FIG. 8.
Figure 14:
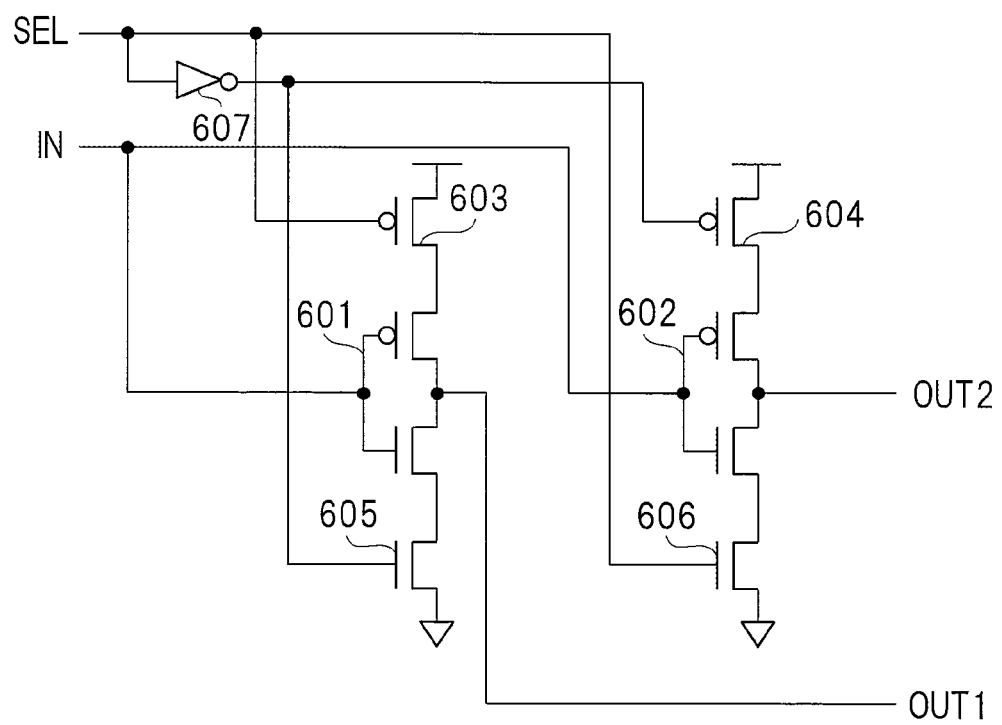
FIG. 14 is a diagram for explaining an example of a circuit configuration of an outlet-side switch of FIG. 7.

FIGS. 13 and 14 are diagrams for explaining an example of a circuit configuration of a switch. FIG. 13 shows an example of a circuit configuration of a switch on the inlet side, and shows a circuit configuration of the switch 430 of FIG. 8 described above and the switch attached to the inlet (Δ) of FIG. 12. FIG. 14 shows an example of a circuit configuration of a switch on the outlet side, and shows a circuit configuration of the switch 420 of FIG. 7 described above and the switch attached to the outlet (▲) of FIG. 11.

FIG. 13 shows an example of a switch having two inputs and one output. The switch of FIG. 13 is suitable for the switch on the inlet side because of causing a signal to deteriorate easily although a small circuit scale. This switch is configured of two CMOS transfer gates 501 and 502 and one inverter 503. Each of the CMOS transfer gates 501 and 502 is configured by connecting a PMOS transistor and an NMOS transistor.

Each of the CMOS transfer gates 501 and 502 is gate-controlled by a selection signal SEL and an inversion signal obtained by inverting this selection signal in an inverter 503 so that input signals IN1 and IN2 inputted into each of CMOS transfer gates 501 and 502 are outputted as an output signal OUT. For example, when a voltage level of the selection signal SEL is high, one CMOS transfer gate 501 is turned ON so as to output the input signal IN1 as the output signal OUT. On the other hand, when the voltage level of the selection signal SEL is low, the other CMOS transfer gate 502 is turned ON so as to output the input signal IN2 as the output signal OUT. As described above, the two input signals IN1 and IN2 can be switched by the selection signal SEL, and be outputted as one output signal OUT.

FIG. 14 shows an example of a switch having one input and two outputs. The switch of FIG. 14 is suitable for a switch on the outlet side because of easily driving a signal although a large circuit scale. This switch is configured of two CMOS inverters 601 and 602, two PMOS transistors 603 and 604 which connect the CMOS inverters 601 and 602 to a power supply potential, two NMOS transistors 605 and 606 which connect them to a ground potential, and one inverter 607. Each of the CMOS inverters 601 and 602 is configured by connecting a PMOS transistor and an NMOS transistor.

The CMOS inverters 601 and 602 output the input signal IN inputted into the gate of each of the CMOS inverters 601 and 602 as the output signals OUT 1 and OUT 2 by the turning ON and OFF of the PMOS transistors 603 and 604 and the NMOS transistors 605 and 606 which are gate-controlled by the selection signal SEL and the inversion signal obtained by inverting this selection signal by the inverter 607, respectively. For example, when a voltage level of the selection signal SEL is low, the PMOS transistor 603 and the NMOS transistor 605 connected to the one CMOS inverter 601 are turned ON so as to output the input signal IN inputted into a gate of this CMOS inverter 601 as the output signal OUT1. On the other hand, when the voltage level of the selection signal SEL is high, the PMOS transistor 604 and NMOS transistor 606 connected to the other CMOS inverter 602 are turned ON so as to output the input signal IN inputted into a gate of this CMOS inverter 602 as the output signal OUT2.

<12. Configuration of Register for Controlling Topology>

Figure 15:
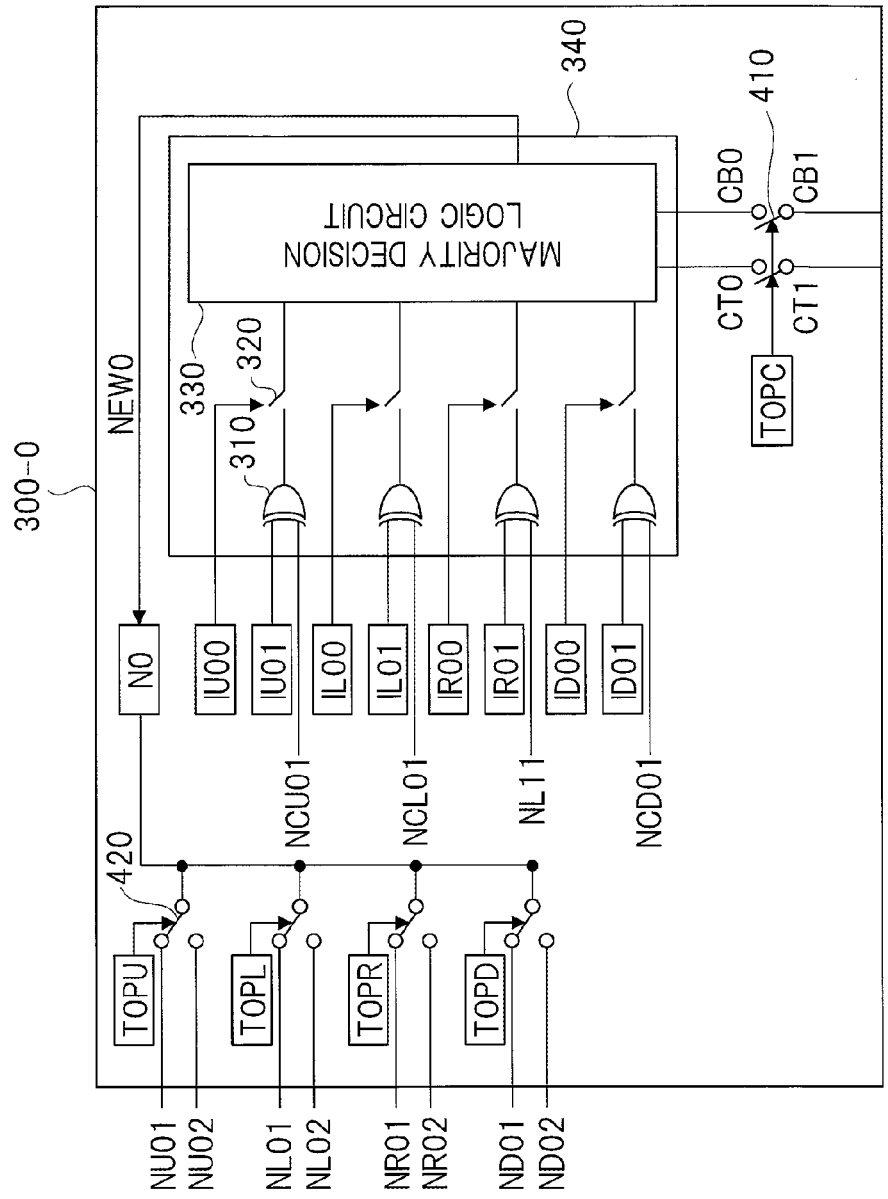
FIG. 15 is a diagram for explaining an example of a configuration of a register (added to all the switches in the spin unit) which controls a topology in the spin array of the Ising chip of FIG. 1.
Figure 16:
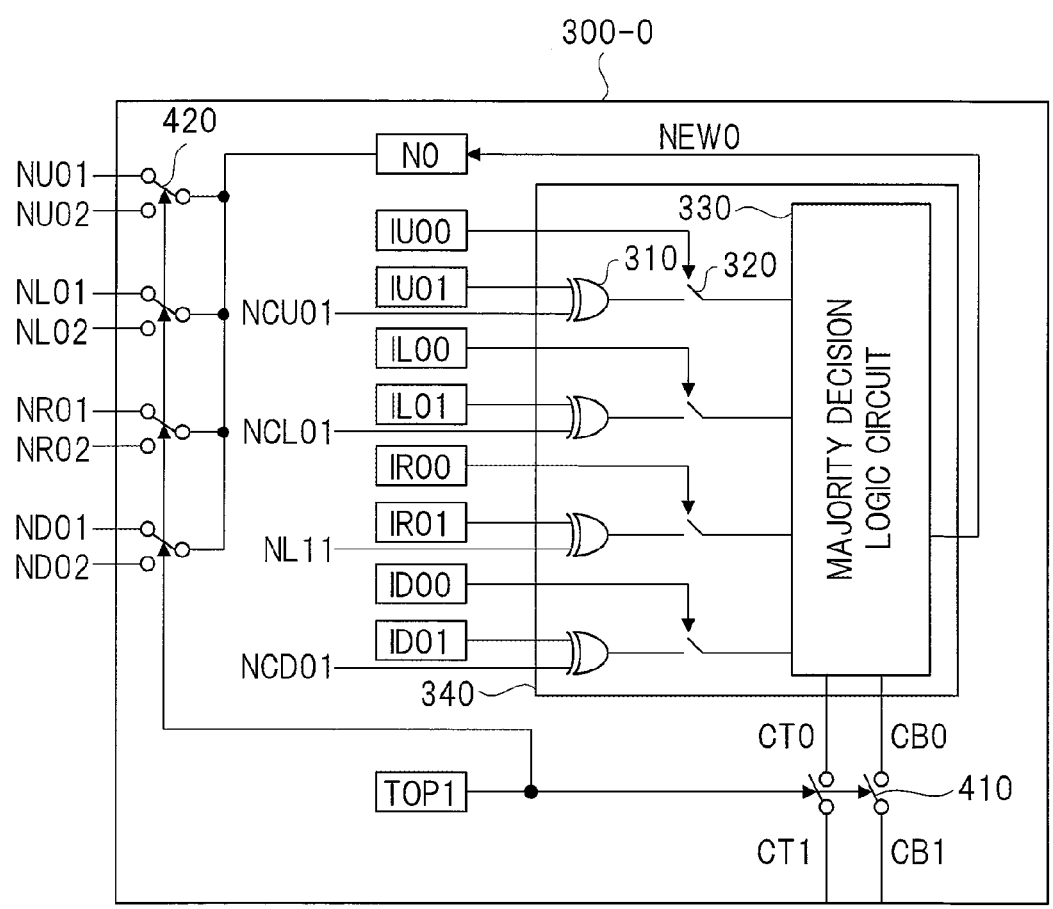
FIG. 16 is a diagram for explaining an example of a configuration of a register (added to each spin unit) which controls a topology in the spin array of the Ising chip of FIG. 1.
Figure 17:
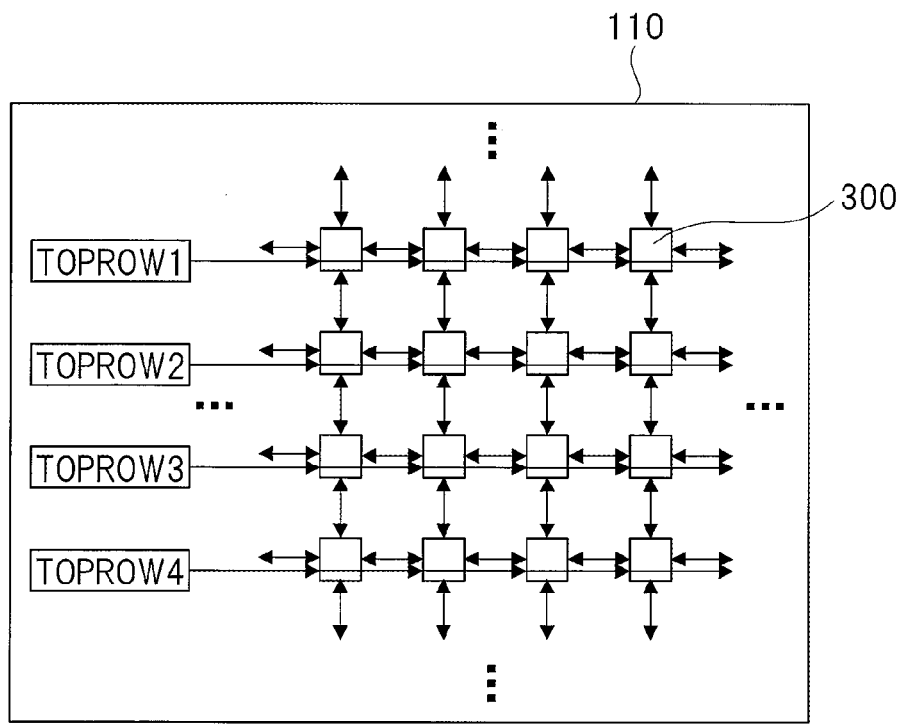
FIG. 17 is a diagram for explaining an example of a configuration of a register (added to each row of the spin array) which controls a topology in the spin array of the Ising chip of FIG. 1.
Figure 18:
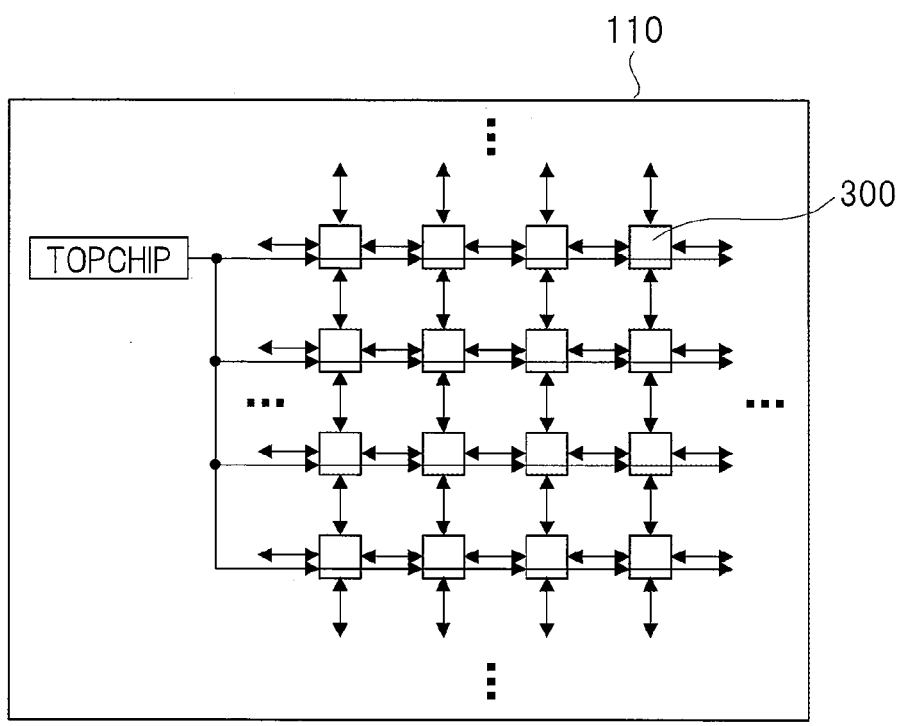
FIG. 18 is a diagram for explaining an example of a configuration of a register (singularly added to entire spin array) which controls a topology in the spin array of the Ising chip of FIG. 1.

FIGS. 15 to 16 are diagrams for explaining an example of a configuration of a register for controlling the topology. FIG. 15 shows an example in which a register is provided to all switches in the spin unit 300. FIG. 16 shows an example in which a register is provided to each spin unit 300. FIG. 17 shows an example in which a register is provided to each row of the spin array 110. FIG. 18 shows an example in which one register is provided to the whole spin array 110.

FIG. 15 shows an example in which a register is provided to each of the switch 410 for coupling or separating the adjacent or distant spin unit and the switch 420 inserted into a part at which the value of the spin is distributed to the adjacent or distant spin unit in the spin unit 300 which are shown in FIG. 7 described above. Note that the register is similarly applicable to the switch 430 inserted into a part at which the value of the spin is inputted from the adjacent or distant spin unit which is shown in FIG. 8 described above.

For example, a value of 1 bit of 1 or 0 is inputted into a register TOPC which is provided to the switch 410 for coupling or separating the adjacent or distant spin unit 300 so as to switch the switch 410 as, for example, an initial setting immediately after operation start. For example, when the value of the register TOPC is 1, the signal lines CT0 and CB0 of one spin unit 300-0 and the signal lines CT1 and CB1 connected to the other spin unit 300-1 (omitted in the drawing) are connected to each other so that two spin units 300 are coupled to each other. In addition, when the value of the register TOPC is 0, the signal lines CT0 and CB0 of one spin unit 300-0 and the signal lines CT1 and CB1 connected to the other spin unit 300-1 are disconnected to each other so that two spin units 300 are separated from each other.

In addition, for example, a value of 1 bit of 1 or 0 is similarly inputted also into each of registers TOPU, TOPL, TOPR and TOPD provided to each switch 420 inserted into a part at which the value of the spin is distributed to the adjacent or distant spin unit 300 so as to switch the switch 410. For example, when a value of the register TOPU is 1, the switch 420 is switched to one side (a state of FIG. 15) so as to distribute a value of the memory cell N0 to an upside spin unit (NU01). In addition, when the value of the register TOPU is 0, the switch 420 is switched to the other side so as to distribute the value of the memory cell N0 is distributed to an upside spin unit (NU02).

The same goes for other registers TOPL, TOPR and TOPD. When a value of each of the registers TOPL, TOPR and TOPD is 1, the switch 420 is switched to one side (a state of FIG. 15) so as to distribute the value of the memory cell N0 to each of a left-side spin unit (NL01), a right-side spin unit (NR01) and a downside spin unit (ND01). In addition, when the value of each of the registers TOPL, TOPR and TOPD is 0, the switch 420 is switched to the other side so as to distribute the value of the memory cell N0 to each of a left-side spin unit (NL02), a right-side spin unit (NR02), and a downside spin unit (ND02).

As shown in FIG. 15, in a configuration in which the registers TOPC, TOPU, TOPL, TOPR and TOPD are provided to all the switches 410 and 420 in the spin unit 300, a complicated topology can be achieved although the circuit scale becomes large.

As compared with FIG. 15 described above, FIG. 16 shows an example in which one register TOP1 is provided to the switch 410 for coupling or separating the adjacent or distant spin unit 300 and the switch 420 inserted into a part at which the value of the spin is distributed to the adjacent or distant spin unit 300. That is, in the example of FIG. 16, the register TOP1 is provided to each spin unit 300. This register TOP1 has a region in which a value of 1 bit of 1 or 0 for collectively switching each of the switches 410 and 420 is can be inputted. And, based on the value of the register TOP1, the operation similar to that of FIG. 15 described above can be performed by switching each of the switches 420 and 430. As shown in FIG. 16, a configuration in which the register TOP1 is provided to each spin unit 300 can handle a little complicated topology in a unit of the spin unit 300.

As compared with FIGS. 15 and 16 described above, FIG. 17 shows an example in which registers TOPROW1, TOPROW2, TOPROW3 and TOPROW4 are provided to each row of the spin array 110 having the spin units 300 arranged in a two-dimensional lattice shape. Each of the registers TOPROW1, TOPROW2, TOPROW3 and TOPROW4 has a region in which a value of 1 bit of 1 or 0 for collectively switching each switch of each row of the spin array 110 can be inputted. And, based on a value of each of the registers TOPROW1, TOPROW2, TOPROW3 and TOPROW4, the operation similar to those of FIGS. 15 and 16 described above can be performed by switching each switch of each row. As shown in FIG. 17, a configuration in which the registers TOPROW1, TOPROW2, TOPROW3 and TOPROW4 are provided to each row of the spin array 110 can change a topology in a unit of the row of the spin array 110.

As compared with FIGS. 15 to 17 described above, FIG. 18 shows an example in which one register TOPCHIP is provided to the whole of the spin array 110 having the spin units 300 arranged in the two-dimensional lattice shape. This register TOPCHIP has a region in which a value of 1 bit of 1 or 0 for collectively switching each switch of the whole of the spin array 110 can be inputted. And, based on a value of the register TOPCHIP, the operation similar to those of FIGS. 15 to 17 described above can be performed by switching each switch of the whole spin array 110. As shown in FIG. 18, a configuration in which the register TOPCHIP is provided to the whole spin array 110 can switch a topology in the whole spin array 110.

<13. Circuit Configuration of Interaction Calculation Circuit>

Figure 19:
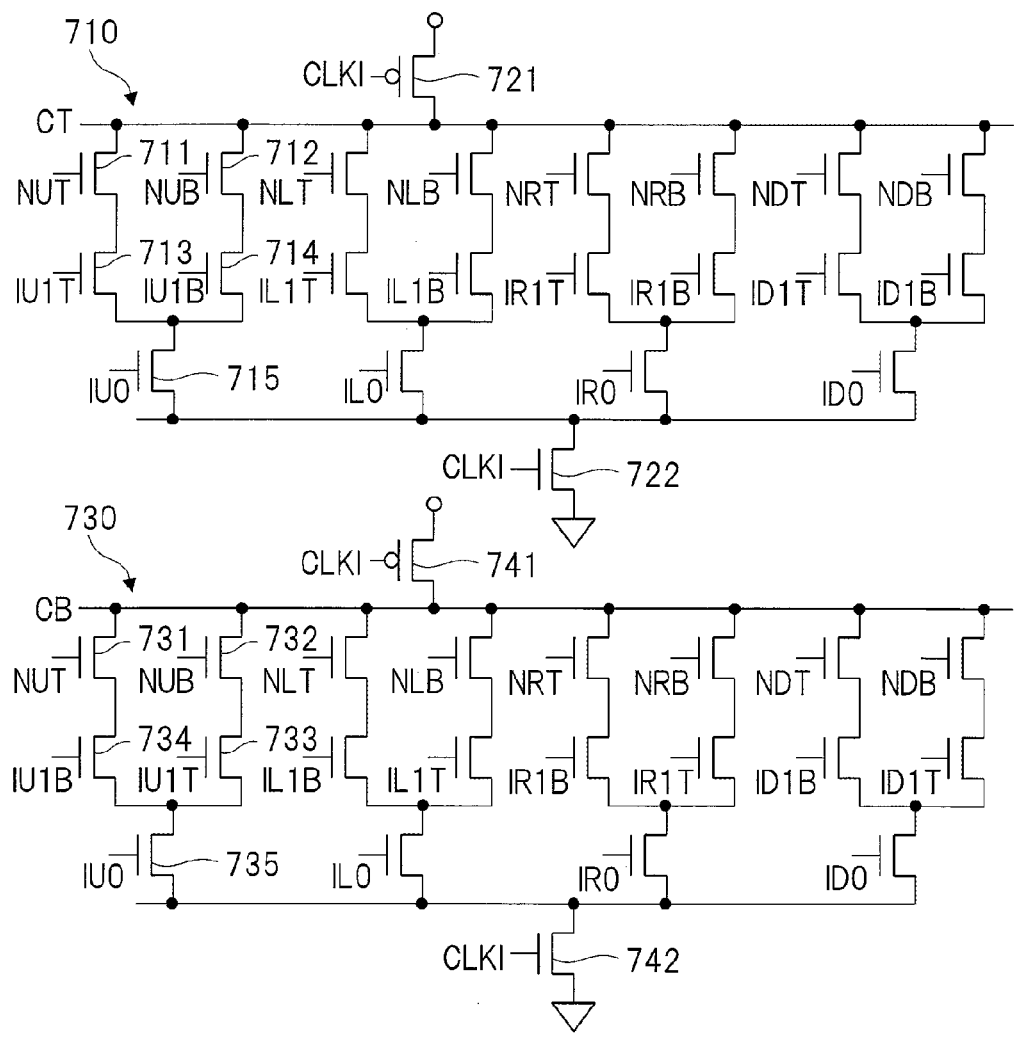
FIG. 19 is a diagram for explaining an example of a circuit configuration (majority decision calculation circuit) of an interaction calculation circuit in the spin array of the Ising chip of FIG. 1.
Figure 20:
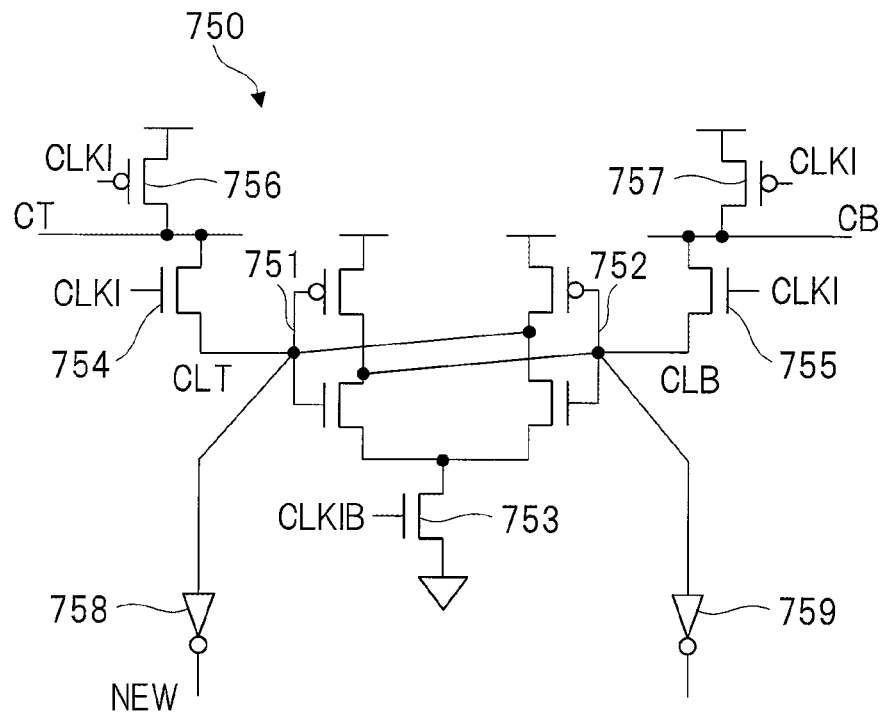
FIG. 20 is a diagram for explaining an example of a circuit configuration (voltage comparison circuit) of the interaction calculation circuit in the spin array of the Ising chip of FIG. 1.
Figure 21:
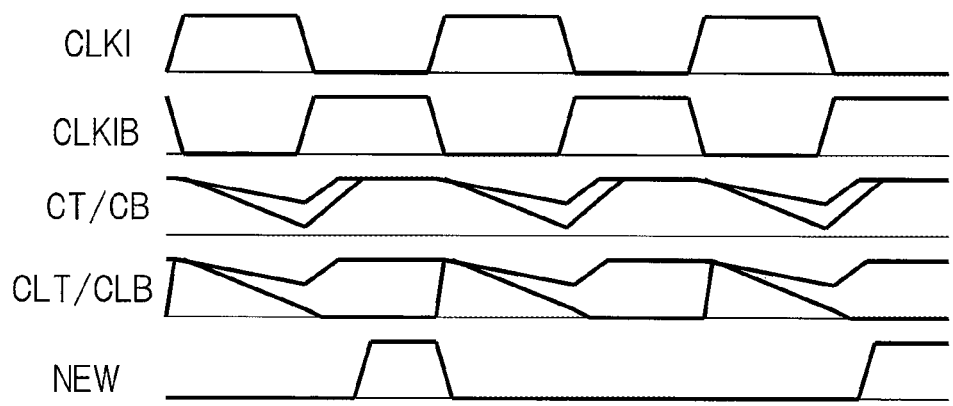
FIG. 21 is a diagram for explaining an example of an operation waveform of the interaction calculation circuit in the spin array of the Ising chip of FIG. 1.

FIGS. 19 to 21 are diagrams for explaining an example of a circuit configuration and an operation waveform of an interaction calculation circuit. That is, the interaction calculation circuit of FIGS. 19 and 20 shows a circuit configuration for achieving a logic circuit of the interaction calculation circuit 340 including the exclusive OR circuit 310, the switching circuit 320 and the majority decision logic circuit 330 in the spin unit 300 shown in FIGS. 7 and 8 described above. FIGS. 19 and 20 show the interaction calculation circuit 340 in one spin unit 300. However, when two spin units 300-0 and 300-1 are coupled to each other, the number of a current path for a parallel connection in the majority decision calculation circuit of FIG. 19 becomes twice, so that the majority decision logic can be achieved based on more spin values. FIG. 19 shows the majority decision calculation circuit, and FIG. 20 shows a voltage comparison circuit provided to a later stage of FIG. 19. In addition, FIG. 21 shows an operation waveform of the interaction calculation circuit of FIGS. 19 and 20.

FIG. 19 shows a circuit configuration of a part used for calculating the majority decision and separated into a +1 calculation circuit 710 for calculating the number of spins of +1 (or, 0 or upside) and a −1 calculation circuit 730 for calculating the number of spins of −1 (or, 1 or downside). In FIG. 19, the +1 calculation circuit 710 is shown on an upper side, and the −1 calculation circuit 730 is shown on a lower side.

The +1 calculation circuit 710 is configured of four sets of blocks of parallel connection configured of five NMOS transistors 711, 712, 713, 714 and 715, a PMOS transistor 721 which connects each block to a power supply potential, and an NMOS transistor 722 which connects each block to a ground potential. The PMOS transistor 721 and NMOS transistor 722 are gate-controlled by a clock signal CLKI shown in FIG. 21. When a voltage level of the clock signal CLKI is high, the PMOS transistor 721 is turned OFF, and the NMOS transistor 722 is turned ON. On the other hand, when the voltage level of the clock signal CLKI is low, the PMOS transistor 721 is turned ON, and the NMOS transistor 722 is turned OFF.

The four sets of blocks are blocks corresponding to interaction coefficients IUx (upside spin), ILx (left-side spin), IRx (right-side spin) and IDx (downside spin), respectively. When attention is focused on the block corresponding to the interaction coefficient IUx, this block is configured of NMOS transistors 711, 712, 713, 714 and 715 which are gate-controlled by NUT, NUB, IU1T, IU1B and IU0, respectively. The NMOS transistors 711, 712, 713, 714 and 715 are turned ON when voltage levels of the corresponding NUT, NUB, IU1T, IU1B and IU0 are high, respectively, and are conversely turned OFF when the voltage levels thereof are low. The NMOS transistors 711 and 713 are connected in series, and the NMOS transistors 712 and 714 are connected in series. The NMOS transistors 711, 713 and the NMOS transistors 712, 714 which are connected in series are connected in parallel.

In this parallel connection, the NMOS transistors 711 and 712 are connected to a common line CT. This common line CT is connected to the power supply potential via the PMOS transistor 721. On this common line CT, a voltage for comparison with the −1 calculation circuit 730 appears. On the other hand, in the parallel connection, the NMOS transistors 713 and 714 are commonly connected to the NMOS transistor 715. This NMOS transistor 715 is connected to the ground potential via the NMOS transistor 722. In this block corresponding to the interaction coefficient IUx, two paths through which the electric current flows are configured.

The same goes for other blocks corresponding to the interaction coefficients ILx, IRx and IDx. The block corresponding to ILx is configured of the NMOS transistors 711, 71.2, 713, 714 and 715 which are gate-controlled by NLT, NLB, IL1T, IL1B and IL0, respectively. The block corresponding to IRx is configured of the NMOS transistors 711, 712, 713, 714 and 715 which are gate-controlled by NRT, NRB, IR1T, IR1B and IR0, respectively. The block corresponding to IDx is configured of the NMOS transistors 711, 712, 713, 714 and 715 which are gate-controlled by NDT, NDB, ID1T, ID1B and ID0, respectively.

The −1 calculation circuit 730 is similarly configured of four sets of blocks of parallel connection configured of five NMOS transistors 731, 732, 733, 734 and 735, and a PMOS transistor 741 which connects each block to a power supply potential, and an NMOS transistor 742 which connects each block to a ground potential. In this −1 calculation circuit 730, a voltage for comparison with the +1 calculation circuit 710 appears on the common line CB. However, the −1 calculation circuit 730 is different from the +1 calculation circuit 710 in that, for example, the NMOS transistor 733 which is gate-controlled by IU1T and the NMOS transistor 734 which is gate-controlled by IU1B are switched and connected in the block corresponding to the interaction coefficient IUx. That is, the NMOS transistors 731 and 734 are connected in series, and the NMOS transistors 732 and 733 are connected in series. The same goes for the blocks corresponding to other interaction coefficients ILx, IRx and IDx.

The +1 calculation circuit 710 and the −1 calculation circuit 730 which are configured as described above have the following operation. Here, for simplicity, while attention is focused on the block corresponding to the interaction coefficient IUx, an operation part for performing a calculation using data inputted from the NU and the interaction coefficient stored in the IU0 and the IU1 will be explained.

The common line CT and the common line CB to which the respective NMOS transistors are connected are precharged to a high potential before performing the interaction calculation, that is, in a period of time when the voltage level of the clock signal CLKI shown in FIG. 21 is low. When the clock signal CLKI becomes high, the NMOS transistors 722 and 742 into which the clock signal CLKI has been inputted are turned on, and the calculation of the interaction value is started.

Data inputted from the NU is divided into complementary signals of the NUT and the NUB. That is, the NUT becomes a value of the NU, and the NUB becomes a value obtained by inverting the NU. In addition, the interaction coefficient IU1 also becomes complementary signals IU1T and IU1B. The IU0 indicates that either one of 0 and 1 is used as the interaction coefficient. When the IU0 is 0, no influence of the value of the interaction coefficient occurs, and therefore, the NMOS transistors 715 and 735 into which the IU0 is inputted is turned OFF so as not to flow the electric current, and therefore, this case does not affect the calculation result. When the IU0 is 1, the NMOS transistors 715 and 735 into which the IU0 is inputted are turned ON, and therefore, the current path associated with the NU and the IU1 is turned ON.

When the values of the NU and the IU1 are equal to each other, the electric current flows through a path of the NMOS transistors 711 and 713 connected in series into which the NUT and the IU1T have been inputted or a path of connected the NMOS transistors 712 and 714 in series into which the NUB and the IU1B have been inputted, and therefore, the potential of the common line CT decreases. On the other hand, when the values of the NU and the IU1 are different from each other, the current flows through a path of the NMOS transistors 731 and 734 connected in series into which the NUT and the IU1B have been inputted or a path of the NMOS transistors 732 and 733 connected in series into which the NUB and the IU1T have been inputted, and therefore, the potential of the common line CB decreases.

The same goes for the blocks corresponding to other interaction coefficients ILx, IRx and IDx. The blocks performs the calculation using data inputted from the NL, the NR and the ND and the interaction coefficients stored in the IL0, the IR0 and the ID0, and the IL1, the IR1 and the ID1, respectively.

That is, the electric current for decreasing the potential of the common line CT flows in the coefficient having the value of the interaction coefficient which is equal to the inputted data, and the electric current for decreasing the potential of the common line CB flows in the coefficient having the value of the interaction coefficient which is different from the inputted data. That is, the current for decreasing the potential of the common line CT flows in the coefficient having the exclusive OR value shown in FIGS. 7 and 8 of 1, and the current for decreasing the potential of the common line CB flows in the coefficient having the value of 0. Therefore, by comparing the voltages of the common line CT and the common line CB with each other, the majority decision indicating which one is larger in the number of the coefficient can be calculated.

A circuit for comparing the voltage between the common line CT and the common line CB described above is shown in FIG. 20. FIG. 20 shows a circuit configuration of the voltage comparison circuit which compares a voltage between the common line CT and the common line CB. A voltage comparison circuit 750 is configured of two CMOS inverters 751 and 752, and an NMOS transistor 753 which connects these CMOS inverters 751 and 752 to the ground potential, and NMOS transistors 754 and 755 which connect each gate of these CMOS inverters 751 and 752 to the common line CT or the common line CB. Further, the voltage comparison circuit 750 is configured of PMOS transistors 756 and 757 which connect the common line CT or the common line CB to the power supply potential, and inverters 758 and 759 connected to respective outputs of the CMOS inverters 751 and 752. A value "NEW" of the next spin state which is an output of this voltage comparison circuit 750 is outputted from an inverter 758.

As for the CMOS inverters 751 and 752, mutually, a gate of one of them is connected to an output of the other, and an output of one of them is connected to a gate of the other. Each gate of the CMOS inverters 751 and 752 becomes a voltage comparison line CLT or a voltage comparison line CLB. Each of the PMOS transistors 756 and 757 and the NMOS transistors 754 and 755 is gate-controlled by the clock signal CLKI. The NMOS transistor 753 is gate-controlled by an inverted clock signal CLKIB obtained by inverting the clock signal CLKI.

This voltage comparison circuit 750 is operated in synchronization with the clock signal CLKI/inverted clock signal CLKIB shown in FIG. 21. In a period when the voltage level of the clock signal CLKI is high, the NMOS transistors 754 and 755 are turned ON so that the common line CT and the common line CB are connected to the voltage comparison line CLT and the voltage comparison line CLB. When the clock signal CLKI becomes low and the inverted clock signal CLKIB becomes high, the NMOS transistors 754 and 755 are turned OFF so that the common line CT and the voltage comparison line CLT are disconnected from each other, and the common line CB and the voltage comparison line CLB are disconnected from each other, and besides, the NMOS transistor 753 into which the inverted clock signal CLKIB has been inputted is turned ON, and therefore, the potentials are compared between the voltage comparison line CLT and the voltage comparison line CLB to be high or low. As a result of this comparison, 0 is outputted as the next state value NEW of the spin when the voltage comparison line CLT is high, that is, when the number of the coefficients having the result of 0 as the exclusive OR between the inputted data and the coefficient is large, and 1 is outputted as the next state value NEW of the spin when the voltage comparison line CLB is high, that is, when the number of the coefficients having the result of 1 as the exclusive OR between the inputted data and the coefficient is large.

The above-described operation is repeatedly executed every time the voltage level of the clock signal CLKI becomes high or low and/or the voltage level of the inverted clock signal CLKIB becomes low or high. By preparing the voltages which appear on the common line CT and common line CB at every time of such repeat as described above, and then, performing the amplifying and the outputting, the coefficient of either +1 (or, 0 or upside) or −1 (or, 1 or downside) which is larger in the number of coefficients can be determined as the next state of the spin.

When the numbers of +1 and −1 are the same as each other, both may be acceptable from the nature of the Ising machine. There is variation in the elements on the circuit, either one of them is determined when they are the same.

<14. Configuration for Making More Complicated Topology>

Figure 22:
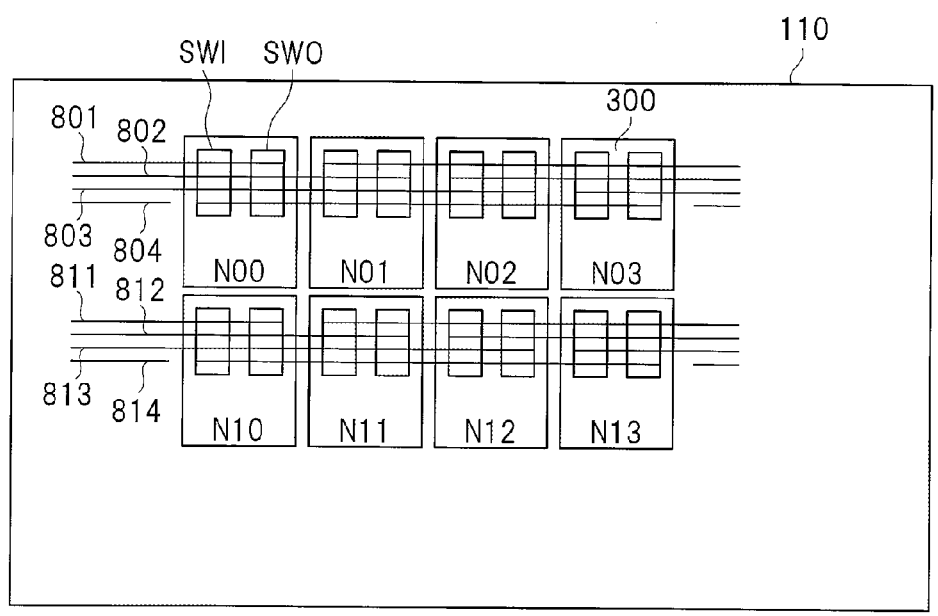
FIG. 22 is a diagram for explaining a configuration example for making a more complicated topology in the spin array of the Ising chip of FIG. 1.

FIG. 22 is a diagram for explaining an example of a configuration for making a more complicated topology. FIG. 22 shows an example in which, four spin units area arranged in the row direction and two spin units are arranged in the column direction in a two-dimensional lattice shape as the plurality of spin units 300 in the spin array 110. For distinguishing the spin units 300 from each other, coordinates (N00, N01, N02 and N03 in the row direction, and N00 and N10 in the column direction) are provided to them for convenience of the explanation. For example, each spin unit 300 is provided with an inlet-side switch SWI and an outlet-side switch SWO. As shown in FIGS. 7 and 8 described above, these switches SWI and SWO are functioned as the switch SWI inserted into a part at which the value of the spin is inputted from the adjacent or distant spin unit and the switch SWO inserted into a part at which the value of the spin is distributed to the adjacent or distant spin unit. Further, the spin units 300 in the row direction are provided with four control lines 801 to 804, respectively.

In such a configuration, the connections of the plurality of spin units 300 can be switched by switching the inlet-side switch SWI and the outlet-side switch SWO by the control lines 801 to 804. For example, when attention is focused on the first control line 801, the outlet-side switch SWO of the spin unit N00 and the inlet-side switch SWI of the spin unit N01 are disconnected from each other in this first control line, and therefore, the spin unit N00 is operated singularly and individually. In addition, the switch outlet-side SWO of the spin unit N01 and the inlet-side switch SWI of the spin unit N02 are connected to each other, and the outlet-side switch SWO of the spin unit N02 and the inlet-side switch SWI of the spin unit N03 are connected to each other, and therefore, the spin unit N01, the spin unit N02 and the spin unit N03 are operated in combination with one another.

In addition, by controlling the switching of the switches based on the similar thinking, the second to fourth control lines 802 to 804 are operated as follows. By the second control line 802, the spin unit N00 and the spin unit N01 are operated in combination with each other, and the spin unit N02 and the spin unit N03 are operated in combination with each other. In addition, by the third control line 803, the spin unit N00, the spin unit N01 and the spin unit N02 are operated in combination with one another, and the spin unit N03 is operated singularly and individually. In addition, by the forth control line 804, all of the spin unit N00, the spin unit N01, the spin unit N02 and the spin unit N03 are operated in combination with one another.

In addition, the spin units 300 of N10, N11, N12 and N13 can be also operated switched by the similar switching using the first to the fourth control lines 811 to 814. In FIG. 22, note that the same operation is performed by controlling the control lines 801 to 804 and the control lines 811 to 814 by the same signal. However, by using different signals for the control lines 801 to 804 and the control lines 811 to 814, the operation is performed so that different control is performed for every row.

As shown in FIG. 22, by providing four control lines 801 to 804 and 811 to 814 in the row direction, and switching the connections by using the inlet-side switch SWI and the outlet-side switch SWO of each spin unit 300, a free topology can be achieved.

In the example of FIG. 22, note that there is no explanation for the column direction. However, the column direction can be controlled as similar to the row direction. In addition, a configuration for the control in both directions of the row direction and column direction is also applicable.

<15. Operation Procedure of Ising Chip>

Figure 23:
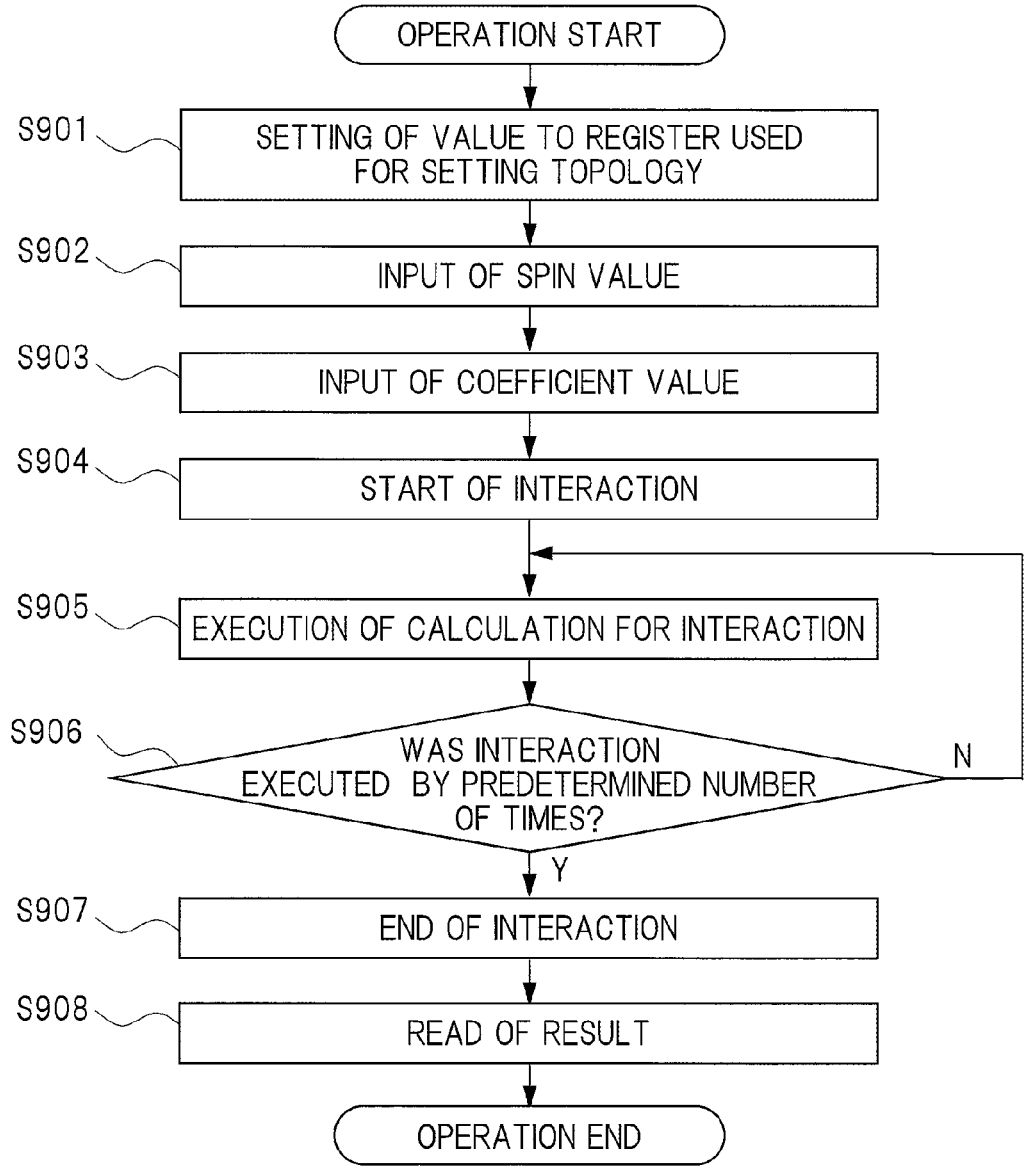
FIG. 23 is a flow chart for explaining an example of an operation procedure of the Ising chip of FIG. 1.

FIG. 23 is a flowchart for explaining an example of operation procedures of the Ising chip 100. FIG. 23 shows procedures for searching the ground state by controlling the Ising chip 100 by the CPU 210 in the information processing device 200 embedded with the Ising chip 100.

Prior to the start of the operation, a value for setting the topology, the value of the spin, the interaction coefficient and the external magnetic field coefficient are created for the Ising model expressing a target problem. As for the value for setting the topology, the value is generated based on the target problem so as to be able to, for example, handle calculation for a more complicated problem and obtain a solution of the problem in a higher speed. As for the creation of the value of the spin, the value is created in, for example, a random number at random.

As an initial setting immediately after the operation start, the value for setting the topology which has been previously created prior to the operation start is set for a register used for setting the topology which is added to the switch of the Ising chip 100 in Step S901. Further, in Step S902 and S903, the value of the spin, the interaction coefficient and the external magnetic field coefficient which have been previously created prior to the operation start are inputted to a memory cell of the Ising chip 100. At this time, the initial setting is completed.

After the initial configuration is completed, execution of the interaction is started in Step S904. When the execution of the interaction is started, calculation for the interaction is executed in Step S905. In this calculation for the interaction, an address is inputted into the Ising chip 100 via the interaction address line 180, and a clock is generated via the interaction clock line 181, so that the interaction is caused within the Ising chip 100. In addition, a voltage supplied to the spin power supply line 141 is controlled so as to follow scheduling. Such control is repeated by a predetermined number of times (Step S906), and the execution of the interaction is ended after the controls of the predetermined number of times are completed (Step S907). As for the predetermined number of times, the optimal number of times in accordance with, for example, the target problem is set.

When the execution of the interaction is ended, the value of the spin which is the calculation result of the interaction is read from the Ising chip 100 in Step S908, and an answer of the Ising model expressing the target problem is obtained. The answer of the Ising model expressing this target problem is obtained, and the operation is ended.

<16. Effect>

The present embodiment described above can provide a technique capable of changing the topology between these spin units 300 by providing the plurality of switches for connecting or disconnecting the adjacent or distant spin units 300 to/from each other in the Ising chip 100 in which the spin units 300 of the basic configuration unit are arranged in the array shape for obtaining the ground state of the Ising model. More details are as follows.

(1) The plurality of switches for connecting or disconnecting the spin units 300 to/from each other include the switch 410 arranged between the spin unit 300-0 and the spin unit 300-1. This manner can couple or separate the spin unit 300-0 and spin unit 300-1 with/from each other, and therefore, the topology can be changed after designing of the Ising chip 100. In addition, by the coupling or the separation between the spin unit 300-0 and spin unit 300-1, a scale can be also changed after the designing of the Ising chip 100.

(2) The plurality of switches for connecting or disconnecting the spin units 300 to/from each other include the switch 420 arranged in an output part. This manner can output the value of the memory cell N0 in the spin unit 300-0 to the spin unit 300-1, and therefore, the topology can be controlled on the data outlet side. The same goes for a case of output of the value of the memory cell N1 in the spin unit 300-1 to the spin unit 300-0, and besides, for a case with the other spin units 300.

(3) The plurality of switches for connecting or disconnecting the spin units 300 to/from each other include the switch 430 arranged in an input part. This manner can input the value of the memory cell N1 in the spin unit 300-1 to the spin unit 300-0, and therefore, the topology can be controlled on the data inlet side. The same goes for a case of input of the value of the memory cell N0 in the spin unit 300-0 to the spin unit 300-1, and besides, for a case with the other spin units 300.

(4) To the switches 410, 420 and 430 in the spin unit 300, registers for storing the values used for controlling switching of the switches are respectively provided. This manner can perform the switching for every switch, and therefore, a complicated topology can be achieved.

(5) To the switches 410, 420 and 430 in the spin unit 300, one register for storing the values used for controlling switching of the switches is commonly provided. This manner can perform the switching for every spin unit 300, and therefore, the little complicated topology can be handled in a unit of the spin unit 300.

(6) To the switches 410, 420 and 430 in the spin unit 300, registers for storing the values used for controlling switching of the switches are provided for every row of the spin array 110. This manner can change the topology in a unit of the row of the spin array 110.

(7) To the switches 410, 420 and 430 in the spin unit 300, one register for storing the values used for controlling switching of the switches is provided for the whole spin array 110. This manner can change the topology in the whole spin array 110.

(8) The switch 420 arranged in the output part from the spin unit 300-0 to the spin unit 300-1 is a switch which can take a plurality of outputs with respect to one input. This manner can output the value of the memory cell N0 in one spin unit 300-0 to a plurality of spin units 300-1 by switching the switch 420, and therefore, the topology can be controlled more finely on the data outlet side. In addition, by configuring this switch 420 by using the CMOS inverter, the signal is easy to be driven.

(9) The switch 430 arranged in the input part from the spin unit 300-0 to the spin unit 300-1 is a switch which can take one output with respect to a plurality of inputs. This manner can input the value of the memory cell N1 in the plurality of spin units 300-1 to one spin unit 300-0 by switching the switch 430, and therefore, the topology can be controlled more finely on the data inlet side. In addition, by configuring this switch 430 by using the CMOS transfer gate, the circuit scale can be reduced.

(10) The interaction calculation circuit 340 includes: the +1 calculation circuit 710 which calculates the number of spins of +1; the −1 calculation circuit 730 which calculates the number of spins of −1; and the voltage comparison circuit 750 which compares the voltages between the common line CT of the +1 calculation circuit 710 and the common line CB of the −1 calculation circuit 730. This manner can compare the voltages between the common line CT corresponding to the number of spins of +1 and the common line CB corresponding to the number of spins of −1 based on each of the value of the adjacent or distant spin, the interaction coefficient and the external magnetic field coefficient, and output the value corresponding to the higher voltage as the value which determines the next state of the spin. That is, the next state of the spin can be determined by binary majority decision logic in each of the value of the adjacent or distant spin, the interaction coefficient and the external magnetic field coefficient.

(11) The spin unit 300 in the spin array 110 includes the inlet-side switch SWI and the outlet-side switch SWO. This manner can switch the connections of the plurality of spin units 300 by switching the switch SWI and the switch SWO by using the control line. More particularly, a free topology can be achieved by controlling the switching in the row direction, the column direction or both directions of the spin array 110.

(12) In the information processing device 200, the control program of the Ising chip 100 writes the value used for setting the topology to the register provided to the switch, and besides, writes the value of the spin, the interaction coefficient and the external magnetic field coefficient in the spin unit 300 in the spin array 110. Then, by repeatedly executing the processing of the ground state search of the spin unit 300 by a predetermined number of times, the value of the spin of the spin unit 300 which has reached the ground state is read, so that the solution to the target problem can be obtained.

In the foregoing, the invention made by the present inventors has been concretely described based on the embodiments. However, it is needless to say that the present invention is not limited to the foregoing embodiments and various modifications and alterations can be made within the scope of the present invention. Further, the other structure can be added to/eliminated from/replaced with a part of the structure of each embodiment.

In addition, in the above-described embodiments, the Ising model which is typical in the field of physics has been exemplified for the explanation. However, the present invention is not limited to this, and is applicable to the whole of the interaction model capable of expressing various physical phenomena and social phenomena.

What is claimed is:

1. A semiconductor device comprising: a plurality of units each of which includes a first memory cell for storing information relating to a value indicating a state of one node of an interaction model calculated by the semiconductor device, a second memory cell for storing an interaction coefficient indicating an interaction from another node connected to the one node, and a calculation circuit for determining a value indicating a next state of the one node based on a value indicating a state of the connected node and the interaction coefficient; and
 a plurality of switches for connecting or disconnecting the plurality of units to/from each other to transfer data from the first memory cell or the second memory cell of one unit of the plurality of units to another unit of the plurality of units, and
 wherein a register for storing a value for controlling switching of each switch is provided to the plurality of switches, and, as for the register, one register is included commonly in the plurality of switches in the plurality of units.

2. The semiconductor device according to claim 1, wherein the plurality of switches include a first switch for connecting or disconnecting a calculation circuit of a first unit to/from a calculation circuit of a second unit among the plurality of units.

3. The semiconductor device according to claim 1, wherein the plurality of switches include a second switch for outputting a value of the first memory cell in a first unit among the plurality of units to a second unit.

4. The semiconductor device according to claim 3, wherein the second switch is a switch which can have a plurality of outputs for one input, and a value of the first memory cell in one first unit is outputted to a plurality of the second units by switching of the second switch.

5. The semiconductor device according to claim 1, wherein the plurality of switches include a third switch for inputting a value of the first memory cell in a second unit among the plurality of units to a first unit.

6. The semiconductor device according to claim 5, wherein the third switch is a switch which can have one output for a plurality of inputs, and a value of the first memory cell in a plurality of the second unit is inputted to one first unit by switching of the third switch.

7. The semiconductor device according to claim 1, wherein a register for storing a value for controlling switching of each switch is provided to the plurality of switches, and, as for the register, the register is included in each of the plurality of switches in the plurality of units.

8. The semiconductor device according to claim 1, wherein a register for storing a value for controlling switching of each switch is provided to the plurality of switches, and, as for the register, the register is included in each row of an array in which the plurality of units are arranged in a two-dimensional lattice shape.

9. The semiconductor device according to claim 1, wherein a register for storing a value for controlling switching of each switch is provided to the plurality of switches, and, as for the register, one register is included in a whole array in which the plurality of units are arranged in a two-dimensional lattice shape.

10. The semiconductor device according to claim 1, wherein the calculation circuit includes: a first calculation circuit for calculating the number of nodes having a first value, the first calculation circuit being configured of a plurality of parallel-connected current paths configured of a plurality of MOS transistors which are gate-controlled based on a value indicating a state of the connected node and the interaction coefficient; a second calculation circuit for calculating the number of nodes having a second value which is different from the first value, the second calculation circuit being configured of a plurality of parallel-connected current paths configured of a plurality of MOS transistors which are gate-controlled based on a value indicating a state of the connected node and the interaction coefficient; and a voltage comparison circuit which compares a voltage of a first common line on which a result of the first calculation circuit appears and a voltage of a second common line on which a result of the second calculation circuit appears by using a pair of CMOS inverters, and which outputs the first value or the second value corresponding to a higher voltage as a value for determining a next state of the one node.

11. The semiconductor device according to claim 1, wherein the plurality of switches include a second switch for outputting a value of the first memory cell in a first unit among the plurality of units to a second unit, and a third switch for inputting a value of the first memory cell in the second unit to the first unit, and each of the plurality of units includes the second switch and the third switch, and connection of the plurality of units is switched by switching the second switch and the third switch by using a control line for controlling switching of each switch.

* * * * *